(12) United States Patent
Soul et al.

(10) Patent No.: US 8,433,254 B2
(45) Date of Patent: Apr. 30, 2013

(54) SYSTEM AND METHOD FOR FREQUENCY OFFSETTING OF INFORMATION COMMUNICATED IN MIMO-BASED WIRELESS NETWORKS

(75) Inventors: Colin H. Soul, Nepean (CA); Roland A. Smith, Nepean (CA); Stephen G. Rayment, Ottawa (CA)

(73) Assignee: BelAir Networks Inc. (CA)

( * ) Notice: Subject to any disclaimer, the term of this patent is extended or adjusted under 35 U.S.C. 154(b) by 0 days.

(21) Appl. No.: 13/595,153

(22) Filed: Aug. 27, 2012

(65) Prior Publication Data

US 2012/0314789 A1 Dec. 13, 2012

Related U.S. Application Data

(60) Division of application No. 12/390,062, filed on Feb. 20, 2009, now Pat. No. 8,254,865, which is a continuation-in-part of application No. 11/399,536, filed on Apr. 7, 2006, now Pat. No. 7,881,690.

(51) Int. Cl.
*H04B 1/38* (2006.01)

(52) U.S. Cl.
USPC ............. 455/73; 455/230; 455/502; 370/350; 375/267

(58) Field of Classification Search ............. 455/73, 455/230, 502; 370/350; 375/267
See application file for complete search history.

(56) References Cited

U.S. PATENT DOCUMENTS

| | | |
|---|---|---|
| 4,755,761 A | 7/1988 | Ray |
| 5,170,500 A | 12/1992 | Broderick et al. |
| 5,198,803 A | 3/1993 | Shie et al. |
| 5,212,827 A | 5/1993 | Meszko et al. |
| 5,483,691 A | 1/1996 | Heck |
| 5,710,998 A | 1/1998 | Opas |
| 5,715,281 A | 2/1998 | Bly et al. |
| 5,761,615 A | 6/1998 | Jaffee |
| 5,835,487 A | 11/1998 | Campanella |

(Continued)

FOREIGN PATENT DOCUMENTS

| | | |
|---|---|---|
| CN | 1482586 A | 3/2004 |
| EP | 1193676 A2 | 4/2002 |

(Continued)

OTHER PUBLICATIONS

The First Office Action from The State Intellectual Property Office of the People's Republic of China for Chinese Patent Application No. 200780012617.3, which was issued Jun. 22, 2011, and the English translation thereof.

(Continued)

*Primary Examiner* — Tuan H Nguyen
(74) *Attorney, Agent, or Firm* — Katten Muchin Rosenman LLP

(57) ABSTRACT

A communications system includes a multiple-input/multiple-output (MIMO) architecture for high capacity switched mesh networks. The MIMO architecture has a plurality of radio frequency chains. One of the plurality of radio frequency chains is configured to apply a first frequency offset to a base frequency of an output signal to generate a first transmitting frequency; and another of the plurality of radio frequency chains being configured to apply a second frequency offset to the base frequency to generate a second transmitting frequency. The system uses the carrier frequency offset to lock the clock of the master subsystem to the clock of the slave subsystem, thereby enabling bandwidth expansion to be employed on the MIMO data streams.

4 Claims, 19 Drawing Sheets

U.S. PATENT DOCUMENTS

| | | | |
|---|---|---|---|
| 5,903,246 | A | 5/1999 | Dingwall |
| 5,952,789 | A | 9/1999 | Stewart et al. |
| 6,091,203 | A | 7/2000 | Kawashima et al. |
| 6,161,004 | A | 12/2000 | Galal et al. |
| 6,229,506 | B1 | 5/2001 | Dawson et al. |
| 6,229,508 | B1 | 5/2001 | Kane |
| 6,344,850 | B1 | 2/2002 | Okumura et al. |
| 6,362,798 | B1 | 3/2002 | Kimura et al. |
| 6,363,123 | B1 | 3/2002 | Balodis |
| 6,424,326 | B2 | 7/2002 | Yamazaki et al. |
| 6,442,380 | B1 | 8/2002 | Mohindra |
| 6,501,466 | B1 | 12/2002 | Yamagishi et al. |
| 6,518,962 | B2 | 2/2003 | Kimura et al. |
| 6,528,950 | B2 | 3/2003 | Kimura |
| 6,560,448 | B1 | 5/2003 | Baldwin |
| 6,683,591 | B2 | 1/2004 | Hashimoto et al. |
| 6,696,105 | B2 | 2/2004 | Hiroki et al. |
| 6,699,739 | B2 | 3/2004 | Yamazaki et al. |
| 6,728,517 | B2 | 4/2004 | Sugar et al. |
| 6,735,422 | B1 | 5/2004 | Baldwin et al. |
| 6,750,833 | B2 | 6/2004 | Kasai |
| 6,753,656 | B2 | 6/2004 | Kimura |
| 6,777,888 | B2 | 8/2004 | Kondo |
| 6,778,594 | B1 | 8/2004 | Liu |
| 6,828,951 | B2 | 12/2004 | Yamazaki et al. |
| 6,885,029 | B2 | 4/2005 | Miyazawa |
| 6,960,962 | B2 | 11/2005 | Peterzell et al. |
| 7,009,573 | B2 | 3/2006 | Hornsby et al. |
| 7,015,884 | B2 | 3/2006 | Kwon |
| 7,022,535 | B2 | 4/2006 | Yamazaki et al. |
| 7,075,508 | B2 | 7/2006 | Kimura |
| 7,103,374 | B2 | 9/2006 | Yla-Jaaski et al. |
| 7,173,279 | B2 | 2/2007 | Yamazaki et al. |
| 7,194,044 | B2 | 3/2007 | Birkett et al. |
| 7,265,714 | B2 * | 9/2007 | Goldberg ............... 342/378 |
| 7,411,937 | B2 | 8/2008 | Guilford |
| 2002/0003586 | A1 | 1/2002 | Busson et al. |
| 2002/0033809 | A1 | 3/2002 | Nakajima |
| 2002/0042256 | A1 | 4/2002 | Baldwin et al. |
| 2002/0061752 | A1 | 5/2002 | Kurokami |
| 2002/0103012 | A1 | 8/2002 | Kim et al. |
| 2002/0167504 | A1 | 11/2002 | Matsumoto |
| 2002/0175635 | A1 | 11/2002 | Komiya |
| 2003/0016190 | A1 | 1/2003 | Kondo |
| 2003/0062844 | A1 | 4/2003 | Miyazawa |
| 2003/0063078 | A1 | 4/2003 | Hanari et al. |
| 2003/0063081 | A1 | 4/2003 | Kimura et al. |
| 2003/0067424 | A1 | 4/2003 | Akimoto et al. |
| 2003/0137503 | A1 | 7/2003 | Kimura et al. |
| 2004/0038649 | A1 | 2/2004 | Lin et al. |
| 2004/0127187 | A1 | 7/2004 | Peterson et al. |
| 2004/0131012 | A1 | 7/2004 | Mody et al. |
| 2004/0196930 | A1 | 10/2004 | Molnar |
| 2004/0214548 | A1 | 10/2004 | Jovenin et al. |
| 2005/0156168 | A1 | 7/2005 | Miyazawa |
| 2006/0063494 | A1 | 3/2006 | Zhang |
| 2006/0109927 | A1 * | 5/2006 | Magee et al. ............. 375/267 |
| 2006/0197080 | A1 | 9/2006 | Yamazaki et al. |
| 2006/0208986 | A1 | 9/2006 | Kimura |
| 2006/0292996 | A1 | 12/2006 | Malasani et al. |
| 2007/0114532 | A1 | 5/2007 | Yamazaki et al. |
| 2009/0258657 | A1 | 10/2009 | Tanaka et al. |

FOREIGN PATENT DOCUMENTS

| | | | |
|---|---|---|---|
| JP | 03-139908 A | 6/1991 |
| JP | 05-158429 A | 6/1998 |
| JP | 11-219146 A | 8/1999 |
| JP | 11-272233 A | 10/1999 |
| JP | 2001-265283 A | 9/2001 |
| JP | 2001-345176 A | 12/2001 |
| JP | 2001-345177 A | 12/2001 |
| JP | 2001-356734 A | 12/2001 |
| JP | 2002-032051 A | 1/2002 |
| JP | 2002-169510 A | 6/2002 |
| JP | 2003-288049 A | 10/2003 |
| WO | 97/05596 A1 | 2/1997 |
| WO | 98/40871 A1 | 9/1998 |
| WO | 02/54606 A2 | 7/2002 |
| WO | 02/075709 A1 | 9/2002 |

OTHER PUBLICATIONS

Transmittal; Written Opinion; and International Search Report for International Application No. PCT/CA2010/000203 with a mailing date of May 18, 2010.

International Search Report for International Application No. PCT/CA2007/000581; mailed on: Jul. 25, 2007.

* cited by examiner

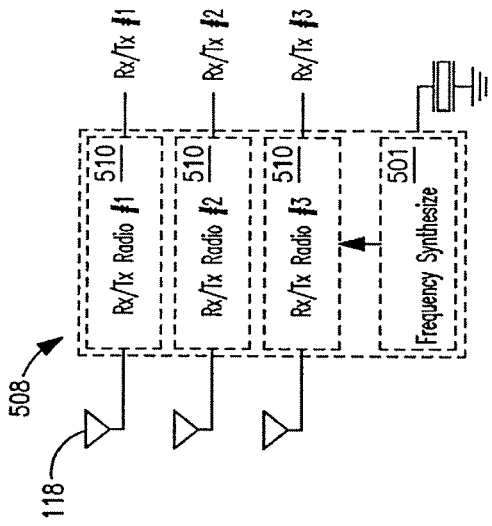
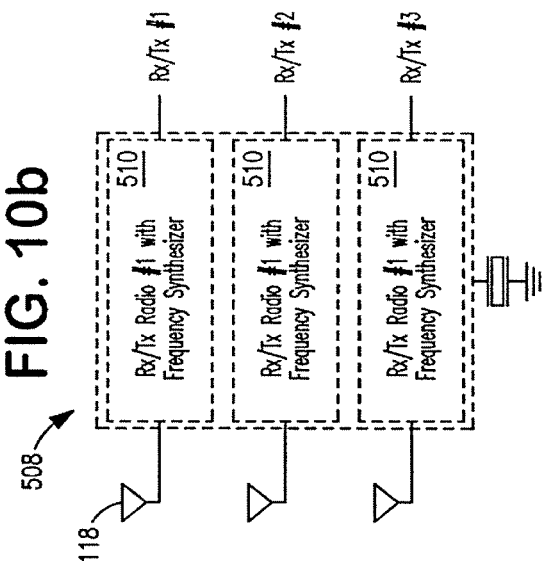
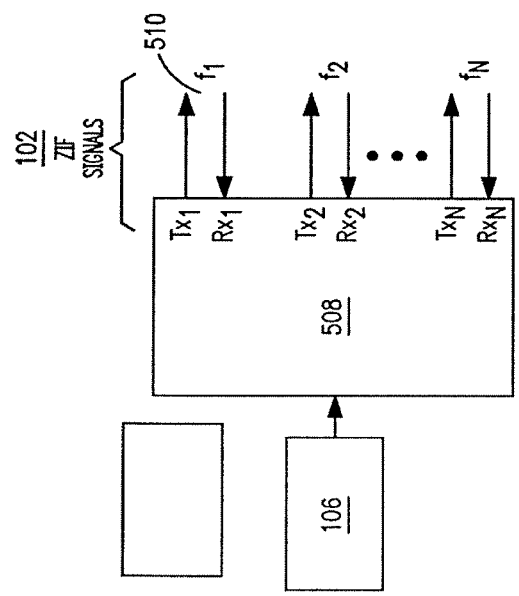
FIG. 10b
FIG. 10e
FIG. 10a

SYSTEM AND METHOD FOR FREQUENCY OFFSETTING OF INFORMATION COMMUNICATED IN MIMO-BASED WIRELESS NETWORKS

CROSS-REFERENCE TO RELATED APPLICATIONS

This application is a divisional of U.S. patent application Ser. No. 12/390,062, filed Feb. 20, 2009, now issued as U.S. Pat. No. 8,254,865, which is a continuation-in-part application of U.S. patent application Ser. No. 11/399,536, filed Apr. 7, 2006, now issued as U.S. Pat. No. 7,881,690, the entire contents of which are incorporated herein by reference.

BACKGROUND OF THE INVENTION

1. Field of the Invention

The present invention relates to communication systems. More specifically, the present invention relates to a system and method for frequency offsetting of information communicated in multiple input/multiple output-based communication systems.

2. Discussion of Related Art

In wireless communication systems, efficient data transmission may be achieved using a multiple input/multiple output system ("MIMO" or "MIMO system"). At its simplest, a MIMO system employs a single transmitter or a plurality of chained transmitters ("chain" or "chains") associated with multiple physical transmitting antennas to send simultaneously multiple data streams ("signals") through a radio channel. The multiple data streams are received by multiple receiving antennas associated with a single receiver or a plurality of chained receivers ("chain" or "chains").

This system results in better spatial utilization of the radio channel bandwidth. In turn, higher throughput, improved link reliability, and improved spectral efficiency are achieved. A MIMO channel includes channel impulse responses or channel coefficients in the flat fading case between different pairs of transmitting and receiving antennas. As is known in the art, a MIMO system may be modeled as $$y=Hx+n \quad \text{(Equation 1)}$$

where x and y are the transmit and receive sign vectors, respectively, n is the channel noise vector, and H is channel matrix.

MIMO systems are most useful in indoor environments where walls, ceilings, and furniture provide a rich multi-path environment, such that the channel matrix allows for multiple independent and orthogonal impulse responses or spatial signatures. In such an environment, the MIMO technology is able to transmit multiple parallel and independent data streams relying on the orthogonal elements of the channel matrix. MIMO systems deployed in highly scattering environments produce high ranked H matrices resulting in higher MIMO capacities even when low correlated antennas are used.

MIMO systems which have been developed for 4G IEEE 802.16e WiMAX systems, have been optimized with two central goals in mind: (1) to maximize/optimize spectral efficiency; and (2) to dynamically achieve improvements in coverage gain or reach by reducing spectral efficiency.

For cellular vendors, spectrum is a precious and limited resource where revenue is defined largely as a function of system capacity and throughput. Spectral efficiency is therefore of paramount importance for these networks where revenue is measured as a functions of carried bandwidth. A significant portion of a cellular provider's operating expenses are from the monthly leasing fees for each cell site.

Maintaining existing cell site coverage is also critical since ubiquity of service is a requirement for any 4G wireless network, and yet the increased delivered channel bandwidth would have reduced link budgets and therefore smaller cell sizes. Cellular providers rely on MIMO technology and the ability to tradeoff capacity for reach at the cell edge to maintain the current cell coverage.

Cellular providers, which are by far the largest economic force driving the advancement of MIMO systems, have maintained the industry focus on spectral efficiency and dynamic reach tradeoff, as well as innovative antenna systems at the base station (BS) and station set (SS) equipment. Those in the WiMAX industry are familiar with "Matrix A" for coverage gain—where a single data stream is transmitted in parallel over two independent transmitter-antenna-receiver paths using space time block codes (STBC) to encode the two streams such that they are orthogonal to each other, thereby improving the signal-to-noise ratio (SNR) at the receiver, resulting in increased cell radius. "Matrix B" was developed for capacity increases which use the spatial multiplexing of MIMO to transmit independent data streams with throughput capacity limited only by the rank of the H matrix and the local noise floor characteristics.

MIMO systems which have been developed for IEEE 802.11n wideband local area network (WLAN) systems have been optimized with the same two central goals driven by the cellular industry's 4G systems—maximizing spectral efficiency and capacity; and optimizing coverage. However, WLAN vendors have overriding industry requirements of solution size, power and cost, as these chipsets are now being embedded in every laptop PC sold as well as in all of the new cellular telephones and personal digital assistants (PDAs). WLAN solution providers have made incredible gains since the first IEEE 802.11b radios were introduced less than a decade ago. WLAN solutions have progressed in the areas of capacity and range as the WiFi standard has evolved from the 11 Mbps systems based on IEEE 802.11b with an effective throughput of 6 Mbps to the 54 Mbps OFDM systems of IEEE 802.11a and IEEE 802.11g with an effective throughput in the range of 25 Mbps. The introduction of IEEE 802.11n with MIMO has been demonstrated to show peak throughputs as high as 300 Mbps and effective throughputs equivalent to 100 Mbps for most house hold applications where MIMO technology is able to perform well.

The same WLAN solutions providers have focused their efforts on cost reduction, by fully integrating chips and radio frequency transmitters to the point that a single chip is able to support all software functions as well as transmit and receive with a zero-IF (ZIF) architecture. Power reduction of these single chip solutions has allowed for a limited mini-PCI power budget of approximately 3 W, supporting a 3×3 IEEE MIMO 802.11n protocol with relatively high powered transmitters in the range of 17 dBm per channel, as high as 20 dBm with the typical <3 dBi gain antennas used in laptops or for WLAN consumer access points. The same WLAN vendors have been less interested in spectral efficiency and have allowed channel sizes to increase from 20 MHz bandwidths to 40 MHz bandwidths.

While MIMO systems operate best in indoor or highly scattering environments which produces high ranked H matrices resulting in higher MIMO capacities, cellular systems employing MIMO are deployed outdoors and often in line-of-sight (LoS) or near LoS (NLoS) applications. High gain antennas—between 10 dBi to 30 dBi—may be used for long distance point-to-point links. It is not as well known in the industry that radio scattering, also called multipath interference, is related directly to the beamwidth of the antenna such that high gain narrow beam antennas will see less multipath interference as do lower gain wide beamwidth antennas. This less obvious fact makes logical sense, as high gain antennas have a narrow antenna beamwidth and therefore a small aperture capable of receiving strong radio signals. Signals received by such a narrow aperture will, in fact, have traveled similar distances resulting in minimal multipath interference. Another way to understand this fact is by considering the reception of a high energy RF "impulse" generated by a transmitter and received by a receiving antenna. The impulse will bounce off of many obstacles, arriving with at the receiving antenna as an impulse response. A receiving antenna with a narrow aperture pointed directly at the source of the impulse will reject any of the longer delay echoes of the impulse, which tend to come from sources which are not directly in-line with the transmitter. Thus, outdoor high gain directional point-to-point MIMO systems cannot rely on multipath dispersion or radio scattering as a means of increasing the rank of the spatial H matrix; however, other means including spatial separation and polarization diversity are possible.

Cellular vendors have long relied on spatial separation to achieve independence of the multipath reflections for antenna diversity receivers in outdoor environments. Many papers have been written regarding spatial separation of receiving antennas. In general, when the receiving antenna is mounted at a low height and is close to reflecting and scattering objects, then a very small separation in the range of one half of a wavelength or just a few inches is required to achieve channel multipath independence. However, when the receiving antennas are mounted high on towers or rooftops, as is most often the case, then small separations have no significant reduction of the correlation of the multipath signatures, and larger separations, on the order of meters, must be used to gain independence of the radio channels. Most antenna systems mounted on rooftops, cell towers, and other elevated structures separate diversity receive antennas by 2 meters or more to achieve path independence to realize gains from antenna diversity. MIMO access systems can rely on the same antenna separation to improve overall throughput.

Polarization diversity can also be used to achieve independence of the radio channel. Most IEEE 802.16e MIMO systems currently being deployed use slant diversity in each of the antennas, and three or more antennas separated by 2 meters each can achieve gains of beam steering as well as a high order channel matrix H. Unfortunately, wireless backhaul networks cannot afford to have multiple receiver antennas separated by two or more meters because of the existing lease agreements for antenna attachment. These lease agreements typically limit an antenna to be less than 1 ft×1 ft×4 ft in total size, including the transceiver equipment itself.

Moreover, cellular providers have further restricted equipment manufacturers of point-to-point radio equipment for backhaul purposes to be less than 1 ft×1 ft×1 ft in total size, and this has become an industry "norm" for such equipment. This restriction effectively limits the allowed antenna gain, but allows for antenna diversity to be used to achieve independence of the MIMO paths and allows for as high as a 2×2 matrix.

Antenna polarization diversity works well for links which are LoS with no possibility of obstacles within the Fresnel zone of the radio. In such cases, the MIMO gains can be determined a priori so that the network planner is able to accurately define how many radio links and their specified bandwidth that will be achieved using the 1 ft×1 ft×1 ft transceivers.

For the case of non-LoS or near LoS point-to-point links that experience time varying reflections, MIMO gains are less well characterized and may only be a fraction of the maximum possible throughput. As an example, a 2×2 MIMO transmission formed using antenna polarization diversity will see continuous polarization rotations if the signals pass through wet foliage, such as trees, after a rainfall. The presence of a few trees in the Fresnel zone typically results in a 10 dB reduction in transmitter signal strength, a condition such that even a light breeze can change the propagation channel more quickly than the hardware algorithms are able to handle and update the channel matrix "H" to maintain full throughput. As a result, for these types of links, the MIMO gains are difficult to quantify for network capacity planning.

Given the difficulties in quantifying the capacity for a 2×2 MIMO point-to-point radio link, the effort becomes even more challenging with a 3×3 or 4×4 MIMO solution. These higher MIMO solutions under ideal conditions deliver significantly higher capacity than a non-MIMO solution, yet their effectiveness is governed by site-specific issues of LoS and near-LoS path characteristics. There are no documented procedures or guidelines which specify assured/minimum MIMO gains for a given antenna separation; therefore, the installer and network planner has no accurate means to know before deploying the MIMO radios what the links capacity will be.

Finally, even under the best conditions of LoS and antenna isolation and separation, interference in an unlicensed band is always an issue. In many environments, unlicensed band interference can be described as a general noise floor, driven by tens, hundreds, or thousands of individual and geographically dispersed sources, where typically just a few sources dominate.

The vast majority of interference sources tend to be in a fixed location—e.g., radiation from microwave ovens or DECT wireless phones, or even pinball machines. Some are mobile, such as Bluetooth devices or laptops. In general, for outdoor point-to-point networks, the noise floor tends to be static in nature, but with sudden changes when a mobile source is introduced near to the point-to-point microwave link. These sources are not well handled by MIMO radio links which are channel specific and are thus affected on all MIMO paths by a single interference source.

Thus, there is a need for an improved MIMO system that provides for greater bandwidth and greater assured reliability. There is also a need for a MIMO system that requires limited antennas to permit usability in limited physical spaces.

In MIMO based technologies such as IEEE 802.11n Wi-Fi or IEEE 802.16e WiMAX, the transmitters have been designed to generate multiple output data streams using common crystal oscillators for the baseband and common local oscillator(s) (LOs) for the conversion to radio frequency (RF), and where the final RF signals are at the same frequencies. The phase variations present in the baseband and LO circuits will be seen equally on all of the MIMO RF signals so that a MIMO receiver can recover timing from any one of the MIMO RF signals and apply that timing to all of the other streams.

For example, a MIMO transmitter generates multiple MIMO RF signals at 5 GHz using a crystal with a +10 parts per million (ppm) error. The RF signals are transmitted over the air at 5 GHz+10 ppm=5,000,050,000 Hz. The MIMO receiver would receive the multiple RF signals using a crystal with a −10 ppm error, so that the down conversion would be with a 4,999,950,000 Hz signal. The resulting signal at baseband would have a frequency error of 100,000 Hz=100 kHz on all MIMO streams, which is easily tracked and removed by the timing recovery function on any one of the recovered MIMO signals.

However, if the system shifts frequency of the MIMO streams to different radio frequencies, a new problem occurs. When these different RF streams are down converted, the resulting errors (as measured in Hz) will be different for each MIMO stream generated from the various RF signals. For example, using the frequency shifter, a 2×2 MIMO transmitter may generate two MIMO RF signals at 5 GHz and 6 GHz using a crystal with a +10 ppm error. These RF signals will be transmitted over the air at 5 GHz+10 ppm=5,000,050,000 Hz and 6 GHz+10 ppm=6,000,060,000 Hz. The MIMO receiver will receive the two RF signals using a crystal with a −10 ppm error, so that the down conversion will be with a 4,999,950, 000 Hz signal and a 5,999,940,000 Hz signal on the first and second MIMO streams respectively. The resulting signals at baseband will have a frequency error of 100 kHz for the first MIMO stream and 120 kHz for the second MIMO stream. If the receiver derives its timing recovery from the first MIMO stream, then the second MIMO stream will have an error of 120 kHz−100 kHz=20 kHz. This 20 kHz error, as seen on a 250 μs packet, will appear as 5 complete rotations of the OFDM constellation, thus making timing recovery impossible for any of the modulation rates. It is noted that the +10 ppm and −10 ppm frequency errors used above are shown only for purposes of a simplified example calculation. Typical WLAN devices use crystals having frequency errors within the range of +/−20 ppm. Further, the above example assumes that the MIMO receiver derives its timing recovery from a single stream. If the MIMO receiver derives its timing on a per-stream basis, then the exemplary 20 kHz frequency error may be inconsequential if the MIMO receiver can support relatively large frequency variations.

Accordingly, there is a need to address the problem of different down conversion frequency errors for frequency-shifted RF streams in MIMO systems.

SUMMARY OF THE INVENTION

These and other objects are met by the current invention. Therein, a communications system includes a multiple-input/multiple-output architecture comprising a plurality of radio frequency chains, wherein one of the plurality of radio frequency chains is configured to apply a frequency offset to a base frequency of an output signal to generate a transmitting frequency.

In one aspect, the invention provides a method of synchronizing a receiver with a transmitter in a communications system comprising a multiple-input/multiple-output (MIMO) architecture. The architecture comprises a first and a second radio frequency chain. The communications system is configured to transceive at least two signals having a predetermined frequency separation. The method comprises the steps of: a) locking a frequency of the receiver to an external timing reference; and b) locking a frequency of the transmitter to the external timing reference. Each of steps a) and b) is carried out independently of one another. The external timing reference may comprise a Global Positioning System (GPS) timing reference or an IEEE 1588 timing reference. The GPS timing reference or the IEEE 1588 timing reference may be configured to be frequency locked to a variable crystal oscillator. The variable crystal oscillator may include a 40-MHz variable crystal oscillator. Alternatively, the GPS timing reference or the IEEE timing reference may be configured to lock a plurality of transceivers such that the method is usable in any of a point-to-point application, a point-to-multipoint application, and a multipoint-to-multipoint application. The IEEE 1588 timing reference may be configured to be frequency locked to a GPS timing reference. In yet another alternative, the IEEE 1588 timing reference may be configured to be frequency locked to a Building Integrated Timing Source (BITS) reference.

In another aspect, the invention provides a method of synchronizing a receiver with a transmitter in a communications system comprising a multiple-input/multiple-output (MIMO) architecture. The architecture comprises a first and a second radio frequency chain. The receiver is connected to a controller. The communications system is configured to transceive at least two signals having a predetermined frequency separation. The method comprises the step of locking a frequency of the receiver to a frequency of the transmitter by configuring the controller to perform the steps of: a) using a packet transmitted by the transmitter and received by the receiver to generate a carrier frequency offset (CFO) estimate; b) adjusting the receiver reference frequency based on the CFO estimate; and c) repeating steps a) and b) until the generated CFO estimate is substantially equal to zero. The controller may comprise at least one of an open-loop controller; a closed-loop controller; a proportional controller; an integral controller; a derivative controller; and a Kalman filter.

In yet another aspect, the invention provides a method of synchronizing a receiver with a transmitter in a communications system comprising a multiple-input/multiple-output (MIMO) architecture. The architecture comprises a first and a second radio frequency chain. The transmitter is connected to a controller. The communications system is configured to transceive at least two signals having a predetermined frequency separation. The method comprises the step of locking a frequency of the transmitter to a frequency of the receiver by configuring the controller to perform the steps of: a) using a packet transmitted by the receiver and received by the transmitter to generate a carrier frequency offset (CFO) estimate; b) adjusting the transmitter reference frequency based on the CFO estimate; and c) repeating steps a) and b) until the generated CFO estimate is substantially equal to zero. The controller may comprise at least one of an open-loop controller; a closed-loop controller; a proportional controller; an integral controller; a derivative controller; and a Kalman filter.

In still another aspect, the invention provides a method of synchronizing a receiver with a transmitter in a communications system comprising a multiple-input/multiple-output (MIMO) architecture. The architecture comprises a first and a second radio frequency chain. The receiver is connected to a controller. The communications system is configured to transceive at least two signals having a predetermined frequency separation. The method comprises the step of locking a frequency of the receiver to a frequency of the transmitter by configuring the controller to perform the steps of: a) using a packet transmitted by the transmitter and received by the receiver to determine an error associated with the transmitted packet; b) adjusting the receiver reference frequency based on the determined error; and c) repeating steps a) and b) until the determined error is substantially equal to zero.

In yet another aspect, the invention provides a method of synchronizing a receiver with a transmitter in a communications system comprising a multiple-input/multiple-output (MIMO) architecture. The architecture comprises a first and a second radio frequency chain. The receiver is connected to a controller. The communications system is configured to transceive at least two signals having a predetermined frequency separation. The method comprises the step of locking a frequency of the receiver to a frequency of the transmitter by configuring the controller to perform the steps of: a) using a packet transmitted by the transmitter and received by the receiver to determine an error associated with the transmitted packet; b) adjusting the receiver reference frequency based on the determined error; c) using a retransmission of the received packet to determine an updated error associated with the retransmitted packet; and d) repeating steps b) and c) until the determined updated error is substantially equal to zero.

In still another aspect, the invention provides a method of synchronizing a receiver with a transmitter in a communications system comprising a multiple-input/multiple-output (MIMO) architecture. The architecture comprises a first and a second radio frequency chain. The communications system is configured to transceive at least two signals having a predetermined frequency separation. The method comprises the steps of: a) locking a frequency of the receiver to a first high precision reference frequency; and b) locking a frequency of the transmitter to a second high precision reference frequency. Each of the first and second high precision reference frequency employs a reference crystal having a maximum frequency error of plus-or-minus 5 parts per million.

In yet another aspect, the invention provides a method of synchronizing a first receiver with a first transmitter and a second receiver with a second transmitter in a communications system comprising a multiple-input/multiple-output (MIMO) architecture. The architecture includes a first and a second radio frequency chain. The communications system is configured to transceive at least two signals having a predetermined frequency separation. The method comprises the steps of: a) using the predetermined frequency separation to determine an acceptable range of error vector magnitudes; b) using the determined range of error vector magnitudes to determine a corresponding range of phase variations; c) using the determined range of phase variations to determine a corresponding range of clock recovery errors; and d) applying a predetermined real time control algorithm to lock a carrier frequency offset of a received signal to within the determined range of clock recovery errors.

Each of the at least two signals may have a carrier frequency within the range of 4.80 GHz to 6.00 GHz. In this instance, the predetermined frequency separation may be less than 1.10 GHz and greater than 0.90 GHz; alternatively, the predetermined frequency separation may be less than 50 MHz and greater than 30 MHz. In another alternative, each of the at least two signals may have a carrier frequency within the range of 2.30 GHz to 3.90 GHz. In this instance, the predetermined frequency separation may also be less than 1.10 GHz and greater than 0.90 GHz, or the predetermined frequency separation may be less than 50 MHz and greater than 30 MHz. Each of the at least two signals may be modulated using a technique selected from the group consisting of 64 Quadrature Amplitude Modulation (64 QAM), 256 QAM, and 1024 QAM.

Step d) may further include applying a least mean squared error algorithm to lock the carrier frequency offset. Alternatively, step d) may further include applying a Kalman filter algorithm to lock the carrier frequency offset. Step d) may also further include using one of a voltage controlled oscillator, a global positioning system (GPS) timing source, an IEEE 1588 timing reference source, or an oven-controlled temperature-compensated crystal oscillator to apply the algorithm.

In another aspect, a system for enabling bandwidth expansion on multiple-input/multiple-output (MIMO) data streams used in high-capacity switched mesh networks is provided. The system comprises a master subsystem and a slave subsystem, each of the master and slave subsystems including a respective transmitter, a respective receiver, and a respective local oscillator. The system is configured to receive at least a first signal having a first carrier frequency and a second signal having a second carrier frequency, the first and second signals having a predetermined frequency separation. The system is configured to align the slave local oscillator to the master local oscillator by applying a real time control algorithm, the real time control algorithm having parameters relating to the predetermined frequency separation and a determined acceptable range of error vector magnitudes and corresponding ranges of phase variations and clock recovery errors.

Each of the first and second carrier frequencies may be within the range of 4.80 GHz to 6.00 GHz. In this instance, the predetermined frequency separation may be less than 1.10 GHz and greater than 0.90 GHz; alternatively, the carrier frequency for each of the first and second signals may be less than 50 MHz and greater than 30 MHz. In another alternative, each of the first and second carrier frequencies may be within the range of 2.30 GHz to 3.90 GHz. In this instance, the predetermined frequency separation may be less than 1.10 GHz and greater than 0.90 GHz; alternatively, the carrier frequency for each of the first and second signals may be less than 50 MHz and greater than 30 MHz. Each of the first and second signals may be modulated using a technique selected from the group consisting of 64 Quadrature Amplitude Modulation (64 QAM), 256 QAM, and 1024 QAM.

The system may be further configured to align the slave local oscillator to the master local oscillator by applying either of a least mean squared error algorithm or a Kalman filter algorithm to lock the carrier frequency offset. The system may further include a voltage controlled oscillator that is configured to align the slave local oscillator to the master local oscillator by applying the real time control algorithm. Alternatively, the system may further include one of a global positioning system (GPS) timing source, an IEEE 1588 timing reference source, or an oven-controlled temperature-compensated crystal oscillator, any one of which may be configured to align the slave local oscillator to the master local oscillator by applying the real time control algorithm.

BRIEF DESCRIPTION OF THE DRAWINGS

FIG. 9b is a schematic view of a further embodiment of a communications system of FIG. 9a.

FIG. 9c is a schematic view of a further embodiment of a communications system of FIG. 9a.

FIG. 10a is a schematic view of a ZIF circuit in accordance with one or more embodiments of the present invention.

FIG. 10b is a schematic view of the ZIF circuit of FIG. 10a in accordance with one or more embodiments of the present invention.

FIG. 10e is a schematic view of the ZIF circuit of FIG. 10a in accordance with one or more embodiments of the present invention.

DETAILED DESCRIPTION OF THE INVENTION

At the digital signal processing (DSP) level, conventional multiple-input/multiple-output (MIMO) systems employ the ability to adjust for small difference in phase and frequency variations caused by a multipath environment. More specifically, MIMO systems are typically able to account for the dynamic nature of the multipath environment, in which reflective elements are moving relative to one another. Generally, such motions have velocities in the range of a walking pace, i.e., up to 2 meters per second. Vehicular motion may include velocities in a range of up to approximately 150 meters per second. Accordingly, MIMO algorithms which account for frequency shifts caused by vehicular motion must allow for frequency shifts of up to 3000 Hz, assuming that f=approximately 6 GHz (given that $v=f*\lambda$, so for $v=c=3\times10^8$ m/s, $\lambda=0.05$ m, and then for $\Delta v=150$ m/s, $\Delta f=150/0.05=3000$ Hz).

Accordingly, although conventional MIMO systems can perform a modest level of phase and frequency adjustments, the range of adjustment is generally only up to a few kilohertz to account for the effects of the mobile multipath environment. Additionally, many conventional MIMO receivers have a design margin, which allows the DSP algorithms to adjust for as much as +/−5 kHz of frequency or phase variations.

However, as described in an example above, the frequency shifter for a 2×2 MIMO transmitter generating two MIMO RF signals at 5 GHz and 6 GHz using a crystal with a +10 ppm error will result in an error of 20 kHz between the two MIMO streams. If the crystal error is +20 ppm, the resulting frequency error is 40 kHz. Such frequency adjustments are well beyond the expected frequency variation that typically results from a mobile multipath environment. Accordingly, the present invention is intended to address this problem by defining a means to mitigate the significant frequency and phase variations that result when MIMO RF streams are independently frequency shifted, thereby enhancing throughput and ensuring a level of system performance having an acceptably low error rate.

Figure 1:
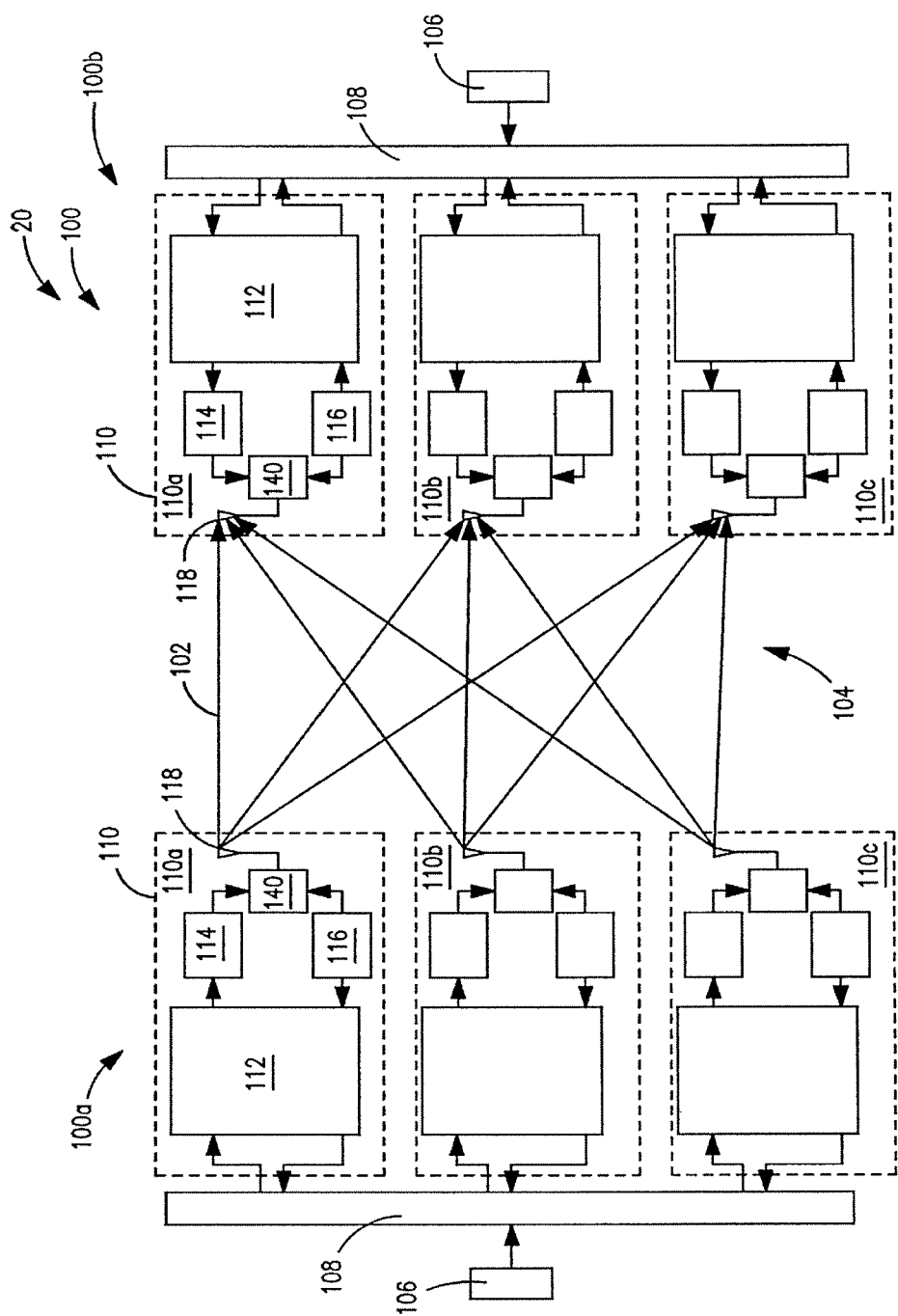
FIG. 1 is a schematic view of a portion of a communication network for communicating information wirelessly in accordance with one or more embodiments of the present invention.
Figure 2:
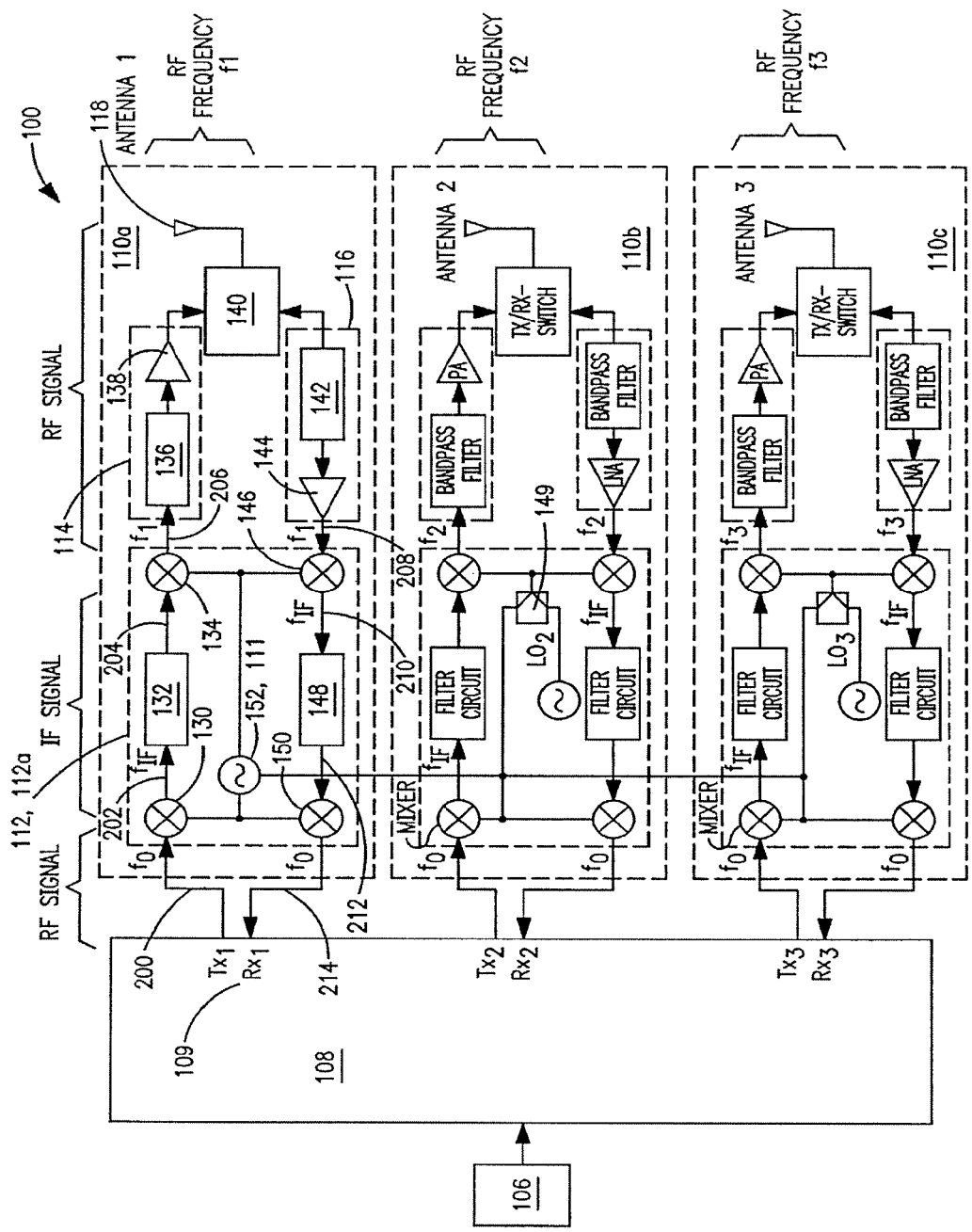
FIG. 2 is a schematic view of the communication system of FIG. 1 comprising a plurality of radio frequency chains that on a transmission side apply an independent frequency offset to a base frequency.

FIG. 1 shows a schematic view of a portion of a communication network for communicating information wirelessly in accordance with one or more embodiments of the present invention. FIG. 2 is a schematic view of the communication system of FIG. 1 comprising a plurality of radio frequency chains that on a transmission side apply an independent frequency offset to a base frequency.

A communication network 20 includes one or more communications systems 100, illustrated generally as systems 100a and 100b, which are in wireless communication with each other. However, the present invention is not limited specifically to wireless communications but may include any other method and means for communication now known or yet to be developed.

Each system 100, e.g., system 100a, 100b, may be a portion of a communication device, automated device, and/or the like and disposed in a receiver, transmitter, transceiver circuit or device and/or the like. For example, system 100, i.e., system 100a may be integrated in a cellular, i.e., mobile, telephone and system 100b may be integrated in a base station. Accordingly, system 100, i.e., 100a, 100b, may each be able to send and receive signals, as will be taught further herein.

System 100 is preferably configured to be operative using multiple input/multiple output architecture ("MIMO" or "MIMO system") to efficiently transmit data to another like or compatible system and within network 20 or any other associated or suitable network. Communications may be achieved according to any suitable communication protocol now known or yet to be developed. Thus, network 20 and/or system 100 may communicate using frequencies and protocols for any IEEE 802.11 protocol or standard, including but not limited to 802.11a, 802.11b, 802.11g and/or 802.11n used as Wireless Local Area Networks ("WLAN"); 802.16d Worldwide Interoperability for Microwave Access ("WiMAX"), 802.16e WiMAX; 4G; 3rd Generation Partnership Project ("3GPP"), or 3rd Generation Partnership Project 2 ("3GPP2") standards based radio, or any other system or protocol.

As simplified for clarity in FIG. 1, a first system 100, e.g., system 100a, transmits multiple data streams via one or more transmitting antennas in a channel 104 to one or more receiving antennas of a suitable receiving system, such as a second system 100, e.g., system 100b, within or associated network 20. Thus, for simplicity, certain drawing figures depict only one system 100 to illustrate both the transmitter-side and receiver-side of system 100.

However, channel 104 comprises a plurality of radio frequency signals 102, i.e., data streams, which are transmitted and/or received from/by one system 100 to/from a suitable communications system in a channel matrix H as defined in Equation 1. Channel 104 may comprises a bandwidth suitable for 802.16d and/or 802.16e protocol. Thus, channel 104 may have a bandwidth of 1.25 MHz; 2.5 MHz; 5 MHz; 7.5 MHz; 10 MHz and/or 20 MHz. Channel 104 may comprises a bandwidth suitable for 802.11n protocol. Thus, channel 104 may have a bandwidth of 5 MHz, 10 MHz, 20 MHz, and/or 40 MHz. However, the bandwidth of channel 104 is not limited to the foregoing, but may include any suitable bandwidth.

System 100 preferably includes a MIMO architecture, e.g., chip set, that comprises a baseband media access controller 106, a zero intermediate frequency communication circuit ("ZIF circuit") 108, and a plurality of receiving and/or transmitting radio frequency chains 110 operable with one or more receiving and/or transmitting antennas 118. Readily available off-the-shelf components may be used in system 100 for reasons of economy and the ability to customize solutions to specific users.

The MIMO architecture may be defined by the number of transmitter side radio frequency chains and receiver side radio frequency chains that operably connect one system 100 to another suitable system, such as a second system 100. Thus, MIMO system having N number of transmitters and M number of receivers is an N×M MIMO system.

Baseband media access controller 106 may be any suitable controller for controlling access to network 20 and includes at least a network-unique identification. Baseband media access controller 106 is in communication with ZIF circuit 108 and may be integrated with it. However, preferably baseband circuit 106 is configured to be standalone.

ZIF circuit 108 may be configured as is known in the art, but preferably comprises a circuit that, as will be taught, comprises one or more embodiments and/or is compatible with one or more embodiments of systems and methods taught in U.S. Ser. No. 11/399,536, filed Apr. 7, 2006, which is hereby incorporated by reference in its entirety for all purposes.

Either or both of the baseband media access controller 106 or ZIF circuit 108 may be part of and/or associated with other devices, such as arrays of digital signal processor elements as are known in the art with regard to high performance MIMO chip sets that provide more processing power than are associated with off-the-shelf MIMO chip sets.

In accordance with one or more embodiments of the present invention, a controller for system 100 may source and terminate the data to be communicated, and may be configured to provide a single integrated function that includes control of all functions of system 100.

ZIF circuit 108 is in communication via one or more physical layer outputs and inputs 109 with the plurality of radio frequency chains 110 such that ZIF circuit 108 may be used in industry standard 802.11n applications. While the exemplary embodiment of FIGS. 1 and 2 illustrate three chains 110, any suitable number of chains of at least two chains may be utilized.

Preferably, to operate under an 802.11n protocol, system 100 comprises three chains 110, while when utilized in a network operating an 802.16d or 802.16e protocol, system 100 comprises four chains 110. Each chain 110, i.e., chains 110a, 110b, and 110c, preferably comprises a filtering module 112; a transmitter circuit 114 for transmitting signals 102 over channel 104; and/or a receiver circuit 116 for receiving signals 102 over a channel 104, depending on whether system 100 is configured to respectively transmit only, receive only, or both; and a switch 140 for switching between transmitting and receiving mode. Preferably, chains 110 are configured to have a transmission side and receiving side such that the chain may be utilized both to receive and transmit.

Although system 100 is illustrated as a Time Division Duplexing ("TDD") system with respect to a preferred operating means in a network operating in accordance with an 802.11n protocol, one skilled in the art will recognize that inventive system 100 may be readily configured as a Frequency Division Duplexing ("FDD") system and utilized with respect to a network operating under WiMAX protocol. For example, one skilled in the art will recognize that the addition of one or more duplexers will permit system 100 to be operable as an FDD system.

On a transmitting side, each chain 110 is preferably configured to receive a common output signal having a predetermined frequency from a physical layer of the MIMO architecture, such as physical layer output 109. Each chain 110 down-converts the signal and applies an independent adjustment to the frequency, i.e., applies a frequency offset to generate a signal 102 for transmitting comprising a frequency that includes an offset from the frequency of the common output signal. Preferably, the transmitting frequency of each chain is different than at least one other transmitting frequency from at least one other chain.

On a receiving side, a respective at least one chain 110 is configured to receive a signal 102 comprising a frequency having a frequency offset and to up-convert the signal to a frequency usable by a controller, such as ZIF circuit 108, and then to pass the signal to a physical layer of the MIMO architecture, such as physical layer input 109. For example, the up-converted frequency may be the same as frequency of the common output signal or it may be different. However, for clarity, it will be assumed that the frequency of the up-converted signal is the frequency of the common output signal, i.e., the common base frequency.

Filtering module 112 may comprise any suitable filtering module, but preferably comprises a filtering module 112a comprising a double conversion filtering process. Each filtering module 112a preferably comprises a first mixer circuit 130 in communication with output signal 200 of ZIF circuit 108 via physical layer output 109. Output signal 200 comprises common base frequency $f_0$ wherein respective receivers and transmitters of system 100 are operable.

In accordance with one or more embodiments of the present invention, output signal 200 may correspond to the frequency output of ZIF circuit. Thus, for each of the chains, respective output signal 200 is provided at the same frequency, base frequency, i.e., first frequency $f_0$. However, output signal 200 may also be or be associated with a baseband frequency produced by a baseband circuit, and/or an intermediate frequency produced by an intermediate frequency output circuit.

Preferably, base frequency $f_0$ may be any suitable frequency that may be used to transmit signals in network 20. Thus, if network 20 is a network using protocol 802.11n, first frequency $f_0$ may be in the 2.4 GHz band. The intermediate frequency $f_{IF}$, which is lower than the first frequency $f_0$, may be any suitable frequency at which filtering may be performed. For example, if the first frequency $f_0$=2.4 GHz, then the intermediate frequency $f_{IF}$ may be $f_0$–810 MHz=1.59 GHz, although the intermediate frequency $f_{IF}$ may be any appropriate frequency that is suitably lower than the first frequency $f_0$. Thus, advantageously, the bandwidth is effectively expanded and greater data delivery is assured.

The first mixer circuit of each chain preferably down-converts signal 200 from the common base frequency $f_0$ to an intermediate frequency $f_{IF}$ to generate a second signal 202. Each intermediate frequency $f_{IF}$ may be different than any other intermediate frequency in the same chain and/or system.

A first filter circuit 132 is in communication with the output of the first mixer circuit and filters the down-converted signal 202 to a filtered down-converted signal 204. While filter circuit 132 may comprise any suitable filter circuit or device that is capable of filtering noise, distortion, and other spurious from a signal, such as down-converted signal 202 at any suitable frequency, filter circuit 132 may also comprise a SAW filter or other suitable filter, such as a hamming filter, brick wall filter, ceramic filter, and/or the like. Filter circuit 132 may also comprise a SAW filter switch bank 170 as taught further herein.

Filtering module 112a preferably includes a second mixer circuit 134 in communication with an output of first filter circuit 132. Second mixer circuit 134 preferably is configured to up-convert the filtered down-converted transmission signal 204 to a third frequency $f_1$, i.e., the transmission frequency, to generate a filtered transmission signal 206. Filtered transmission signal 206 comprises the transmission signal 200 with the noise, distortion and other spurious signals removed or substantially reduced.

First and second mixer circuits 130 and 134 provide a double-conversion by translating the transmission signal 200 at first frequency $f_0$ to an intermediate frequency $f_{IF}$ for filtering, and then translating the resulting filtered signal at intermediate frequency $f_{IF}$ to a higher, third transmitting frequency $f_1$ for transmission. In this manner, an adjustment, which is independent from adjustments by another chain, is made to the base frequency, i.e., a frequency offset is applied, to generate a signal for transmitting. The signal comprises a frequency that includes an offset from the frequency of the common output signal.

Therein, the first frequency $f_0$ and the third frequency $f_1$ may be, but preferably is not, substantially identical, although the third frequency $f_1$ may be any suitable frequency that is higher than the intermediate frequency $f_{IF}$ and the same or different frequency than the first frequency $f_0$. The difference in frequency between frequency $f_0$ and frequency $f_1$ comprises the frequency offset.

The frequencies of the first frequency $f_0$ and the third frequency $f_1$ will depend on such factors as, for example, the nature and type of transmission scheme and protocol used, the transmission characteristics of ZIF communication circuit 108 or other like transmitter, receiver, transceiver or communication circuit/device used, and other like factors.

Filtered transmission signal 206 may be transmitted using transmitter circuit 114 or any suitable transmitter or communication circuit or device. The output of second mixer circuit 134 is preferably in communication with transmitter circuit 114.

Transmitter circuit 114 may be configured to transmit the filtered transmission signal 206. Preferably, transmitter circuit 114 includes a suitable bandpass filter 136 that receives and appropriately filters the filtered transmission signal 206.

For example, for WiFi signals, the bandpass filter 136 may be used to filter or otherwise limit the frequency width of filtered transmission signal 206 to the WiFi frequency band so as not to interfere with other signals. The resulting bandpass-filtered signal is appropriately amplified or otherwise raised in power level by a power amplifier 138 or other suitable power amplifier in communication with the bandpass filter 136.

Preferably, since the filtered transmission signal 206 is cleaner, by, for example, having a clean spectrum with little or no noise or distortion, as a result of passing through the filtering module 112, the power level of the signal may be raised to greater levels to increase the transmission power without the concomitant increase in noise and other spurious signals.

The amplified signal 206 from power amplifier 138 can be passed to a transmitter/receiver diversity switch 140 for transmission via physical antenna 118 using a suitable wireless transmission protocol, although the amplified signal may be alternatively transmitted via an appropriate wired connection using a suitable wired protocol or standard. Transmitter circuit 114 and accompanying transmission components can include additional and/or alternative elements necessary for wireless or wired signal transmission, depending on, for example, the type of signals being transmitted, the communication medium and protocol, and other like factors.

Transmitter/receiver diversity switch 140 may instead comprise an operative connection to separate receiving and transmitting antennas.

System 100 may be configured to receive wireless signals 102 via a receiving antenna, which can be the same or different antenna than antenna 118. The signals received via the receiving antenna are passed via the transmitter/receiver diversity switch 140 to a receiver circuit 116.

Receiver circuit 116 is configured to receive signals for the system 100 and may comprise a suitable bandpass filter 144, which receives and appropriately filters the received signals. For example, for WiFi signals, bandpass filter 144 may be used to filter or otherwise limit the frequency width of the received signals to the WiFi frequency band to remove out-of-band noise or other interfering signals.

The resulting bandpass-filtered signal is appropriately amplified by a suitable low-noise amplifier 144 in communication with bandpass filter 142. Receiver circuit 116 and accompanying receiver components may include additional and/or alternative elements necessary for wireless or wired signal reception, depending on, for example, the type of signals being received, the communication medium and protocol, and other like factors. The output of receiver circuit 116 is a received signal 208. Since signal 208, e.g., signal 102, is received from a like system, the frequency of signal 208 preferably is the same as that of the transmitted signal, e.g., the frequency of signal 208 comprises transmitted frequency $f_1$.

Filtering module 112a includes a third mixer circuit 146 which has an input in communication with an output of the receiver circuit 116. Preferably, third mixer circuit 146 is configured to receive received signal 208 at frequency $f_1$. Third mixer circuit 146 may be configured to down-convert the received signal 208 at frequency $f_1$ to an intermediate frequency $f_{IF}$ to generate a down-converted received signal 210.

Filtering module 112a preferably includes a second filter circuit 148 in communication with an output of third mixer circuit 146. Second filter circuit 148 is configured to filter the down-converted received signal 210 to generate a filtered down-converted received signal 212 at the intermediate frequency $f_{IF}$, which may be a different intermediate frequency than any other intermediate frequency in the same or different chain or in system 100.

Second filter circuit 148 may comprise any suitable type of filter circuit or device that is capable of filtering noise, distortion and other spurious signals from the down-converted received signal 210 at the intermediate frequency $f_{IF}$. Second filter circuit 148 may be configured substantially similar to first filter circuit 132.

Filtering module 112a preferably includes a fourth mixer circuit 150 in communication with an output of the second filter circuit 148. Fourth mixer circuit 150 is preferably configured to up-convert the filtered down-converted received signal 212 to the base frequency $f_0$ to generate a filtered received signal 214. ZIF circuit 108 or other like transmitter, receiver, transceiver or communication circuit/device is in communication with an output of the fourth mixer circuit 150 via physical layer input 109.

Filtered received signal 214 comprises received signal 208 with the noise, distortion and other spurious signals removed or substantially reduced. The third and fourth mixer circuits 146 and 150 provides double-conversion of the received signal 208 at transmitted frequency $f_1$ to a lower, the intermediate frequency $f_{IF}$ for filtering, and then translating the resulting filtered signal to a higher, base frequency $f_0$ for reception by the ZIF circuit 108. In this manner, the frequency offset is reversed to generate a signal for use by a controller that comprises a frequency of the common output signal.

Filtering module 112 includes one or more local oscillator circuits 152 in communication with the first, second, third and fourth mixer circuits 130, 134, 146, and 150 to control the mixing frequencies of the plurality of mixer circuits.

However, local oscillator circuit 152 may use any suitable frequency control signal or the like to control the mixing frequencies of each or any combination of the first, second, third and fourth mixing circuits 130, 134, 146 and 150. Oscillator circuit 152 may comprise any suitable type of RF oscillator circuit or the like, including a suitable Phase Locked Loop ("PLL") oscillator circuit or the like. Therein, all local oscillators are associated with a common frequency controller 111, i.e. clock, for controlling the respective mixing frequencies.

Chains 110b and 110c are configured similarly by varying the oscillation to produce transmitting frequency $f_2$ and $f_3$. In this manner, an adjustment, which is independent from adjustments by another chain, is made to the base frequency, i.e., a frequency offset is applied, to generate a signal for transmitting having respective frequencies $f_2$ and $f_3$. Therein, the difference in frequency between frequency $f_0$ and frequency $f_2$ or $f_3$ comprises the frequency offset. Similarly, chains 110b and 110c are configured to receive frequencies $f_2$ and $f_3$ and reverse the frequency offset to generate a signal for use by a controller that comprises a base frequency $f_0$ of the common output signal.

Modifications and variations to filtering module 112, transmission module 114, and/or receiving module 116 may be made by one skilled in the art for increasing gain, achieving particular filtering, and/or any other suitable purpose and such are contemplated in the present invention.

In accordance with one embodiment of the present invention, one oscillator circuit 152, but not the other oscillator circuits, i.e., the master oscillator circuit may comprise or be associated with frequency controller 111, i.e. clock, for controlling the respective mixing frequencies. Frequency controller 111 may be disposed in any one of the oscillator circuits 152, but not the others, or in addition thereto may be associated with ZIF circuit 108.

Each of the local oscillators may be configured to comprise different oscillation frequency in cooperation with each of the respective chains in system 100. In the exemplary embodiment of FIGS. 1 and 2, while one chain 110 produces a transmitting frequency $f_1$, a second chain 110 may generate a third frequency $f_2$ and chain 110 may generate a third frequency $f_3$. Therein, each frequency $f_1$, $f_2$, and $f_3$ is offset from the base frequency $f_0$ and each is different from the other.

Thus, for the exemplary embodiment of FIGS. 1 and 2, a 3×3 MIMO system comprises RF chains for individually adjusting the frequency of signals 102 in a channel 104. The matrix for channel 104 is shown in Equation 2 or more explicitly in Equation 3, wherein a superscript indicates the frequency that has been offset.

$$H = \begin{bmatrix} h_{11} & 0 & 0 \\ 0 & h_{22} & 0 \\ 0 & 0 & h_{33} \end{bmatrix} \quad \text{(Equation 2)}$$

$$H = \begin{bmatrix} h_{11}^{f_1} & 0 & 0 \\ 0 & h_{22}^{f_2} & 0 \\ 0 & 0 & h_{33}^{f_3} \end{bmatrix} \quad \text{(Equation 3)}$$

Therein, the matrix coefficients are expressed as $h_{TR}$, where T is the transmitting module on a respective chain, and R is the receiving module on a respective chain and indicated by numerals. It should be appreciated that if the number of chains that are present=n, the matrix may be suitably adjusted.

Thus, $h_{22}$ comprises a transmission from one RF chain 110 of a system 100 and received by a second RF chain 110 on a second system 100. Preferably, frequencies are selected such that the cross-products of one transmitting chain to another receiving chain having a different offset frequency are almost zero due to frequency independence. For example, frequency offsets may range up to 60 Hz.

Preferably, frequencies chosen are adjacent channels, second adjacent channels or similarly situated other channels. Many of the modulation techniques used for MIMO systems comprise high levels of out-of-band emissions that fall in the adjacent and next adjacent channel. The emissions create high levels of co-channel interference, as for example in the exemplary embodiment of FIG. 2, from frequencies $f_0$ to $f_1$, and $f_1$ to $f_0$, use of these channels preferably includes filtering module 112.

For channels which are not adjacent or next adjacent, additional filtering is not required. Thus, signal 206 may be generated without filtering to a new frequency by using a down-conversion or up-conversion in each chain. Thus, unlike the "integrated wireless transceiver" disclosed in U.S. Ser. No. 11/158,728, which was published as U.S. Patent Publication 2006/0292996 on Dec. 28, 2006, and which is hereby incorporated by reference for all purposes, a greater flexibility is offered.

Alternatively, frequency offsets may also be produced using a baseband input with a double heterodyne architecture such that the resulting frequencies are different. As one skilled in the art will recognize, a standard high frequency radio design, which commonly in high power high performance radio designs, and when developed over several chains offers a greater flexibility.

The frequencies may be in the same or different bands, and these bands may be licensed or unlicensed. In the unlicensed industrial, scientific and medical ("ISM") radio bands, system 100 may comprise additional controls for handling functionality such as dynamic frequency selection ("DFS"), with radar detection. For example, each receiver side of the filtering module 112 may comprise a means to detect radar pulses to meet FCC or international rules for DFS. Preferably, the controls are configured to detect radar pulses on the unlicensed band frequencies and dynamically change channels if required. In contrast, a standard MIMO system that does not incorporate a frequency offset comprises only a single radar detector since all MIMO operations are performed on a common frequency.

In accordance with one or more embodiments of the present invention, further flexibility may be provided for system 100 by selectably operating local oscillator circuit 152 of chain as a common oscillator circuit is operatively connected to one or more of the other local oscillator circuits. Using a switch 149, the local oscillator circuit may be bypassed in favor of a common oscillator circuit such that the same frequency is generated. Advantageously, when necessary, system 100 may be switched from a MIMO system to a standard system.

In accordance with one or more embodiments of the present invention, antenna 118 may comprise two separate antennas, a first antenna comprising inputs for vertical and horizontal polarization and second comprising a single or dual input. Therein, one frequency, frequency $f_1$, is connected to a first antenna, a second and third frequencies, e.g., frequency $f_2$ and frequency $f_3$, are connected to a second antenna and wherein the polarizations of may be aligned or reversed to the polarizations of at least one of the receiving chains and wherein a third frequency, e.g., frequency $f_3$, is aligned in polarization to at least another of the receiving chains.

Antenna 118 may comprise two separate antennas with separate inputs for vertical and horizontal polarization, two separate antennas, each with inputs for circular polarization, and used in the fashion described above, two separate antennas, each with inputs for a common polarization to allow beam steering of one frequency, frequency $f_1$, and non-beam steering of a second frequency, frequency $f_2$, on the second antenna. Antenna 118 may also comprise one common antenna, with three inputs and a common polarization to allow beam steering of one frequency, but not the other frequencies.

Advantageously, system 100 configured as a 3×3 MIMO system achieves a bandwidth expansion by a factor of two to achieve an assured bandwidth for this link which is roughly equivalent to that of two 2×2 MIMO system with a 1×1 single-input/single-output system.

Figure 3B:
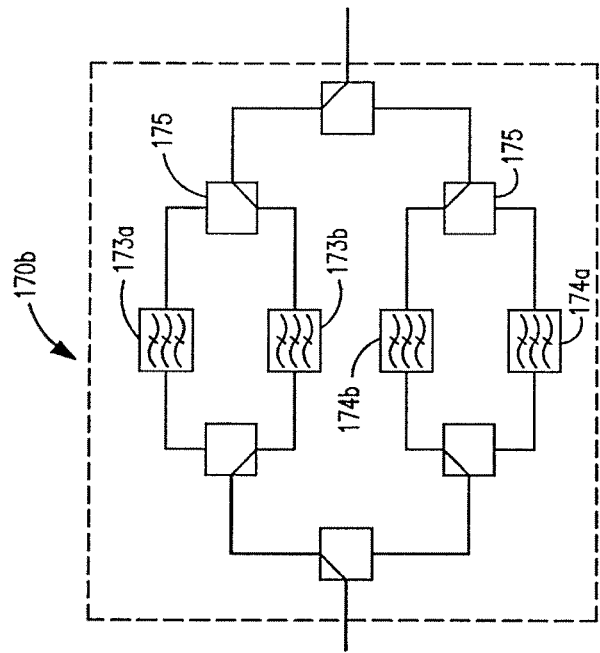
FIGS. 3a and 3b are schematic views of a filter circuit in accordance with one or more embodiments of the present invention.
Figure 3A:
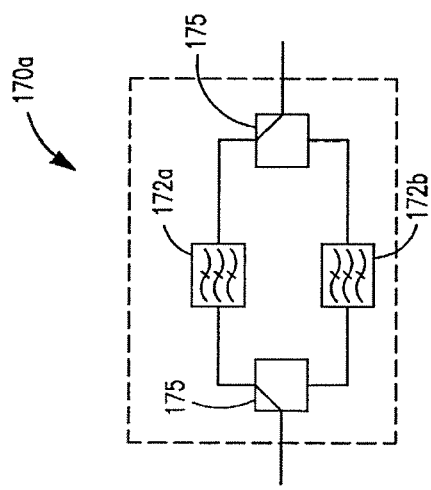

FIGS. 3a and 3b are schematic views of a filter circuit in accordance with one or more embodiments of the present invention. Filter circuit 132 and/or filter circuit 148 may comprise SAW filter switch bank 170 in order to improve the link budget of system 100 due to frequency offset that is applied. A switch bank 170a may comprise a first SAW filter 172a and a second SAW filter 172b placed in parallel to each other. A plurality of switches 175 permit the selection of one or the other filter 172 and by routing signals, respectively, from or to a common input or output. Similarly, a switch bank 170b may comprise a first SAW filter 173a and a second SAW filter 173b connected in parallel to each other and a third and fourth SAW filter 174a and 174b connected in parallel each other, respectively. A plurality of switches 175 permit the selection of one or the other filter 173 or 174 by routing signals, respectively, from or to a common input or output.

For example, a channel 104 may be a standard MIMO channel of 20 MHz and comprises a typical thermal noise floor of −174 dBm/Hz or −101 dBm. Using two MIMO streams with spatial diversity, the link budgets, e.g. the total of all of gains and losses from the transmitter to the receiver, will be the same, assuming that the MIMO streams do not self interfere. The noise bandwidth will remain at 20 MHz or −101 dBm.

Using a single 40 MHz channel, the throughput will be equivalent to a dual MIMO throughput for a 20 MHz channel, however, the link budget will suffer by 3 dB as the 40 MHz wide noise floor will be at −98 dBm. Using two independent 20 MHz channels, with a SAW filter circuit, the noise floor per MIMO stream will be −101 dBm, ensuring that the link budgets remain equivalent to a single 20 MHz channel, but using 40 MHz of spectrum.

Figure 4:
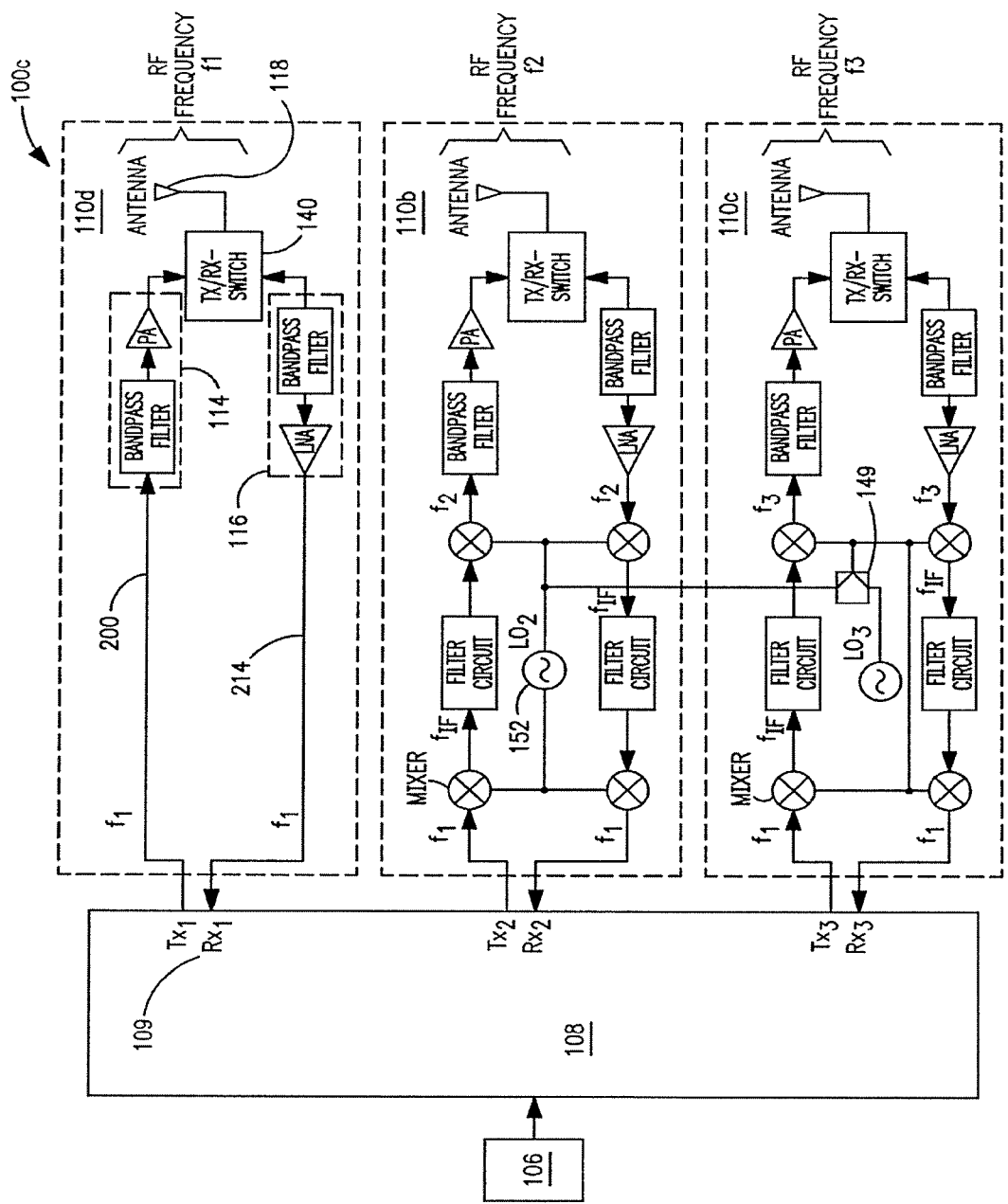
FIG. 4 is a schematic view of a communication system in accordance with one or more further embodiments of the present invention wherein the communications system comprises a radio frequency chain that on a transmission side utilizes a base frequency and one or more radio frequency chains that on a transmission side apply an independent frequency offset to a base frequency.

FIG. 4 is a schematic view of a communication system in accordance with one or more further embodiments of the present invention, wherein the communications system comprises a radio frequency chain that, on a transmission side, utilizes a base frequency, and one or more radio frequency chains that, on a transmission side, apply an independent frequency offset to a base frequency. System 100c is preferably configured to be operative using MIMO architecture to efficiently transmit data between another system 100c and/or other compatible and/or suitably configured system. Thus, system 100c may be operative with other systems 100, such as systems 100a and/or 100b, taught herein and comprises essentially like architecture to these system. Thus, the teachings of system 100, i.e., 100a and/or 100b, are repeated here. However, system 100c varies in certain aspects.

Advantageously, system 100c provides a cost-effective solution by simplifying the architecture and reducing the number of components. System 100c permits the independent adjustment of the frequency of one or more chains while one chain's frequency is linked to the ZIF circuit. In a network operating an 802.11 protocol, wherein three chains are used, at least two chains are independently adjustable to obtain a desired offset frequency while one chain's frequency is substantially identical to the frequency of an output signal of ZIF circuit 108. Accordingly, rather than a having a chain 110a that includes a filtering module 112, system 100c includes a chain 110d comprising transmitting module 114 and a receiving module 116 that in direct communication with ZIF circuit 108, and a switch 140.

As disclosed, ZIF circuit 108 produces common output signal 200 at a frequency sufficient for transmission. Thus, first frequency $f_0$ may be equal to third frequency $f_1$ and may be transmitted as signal 102 after appropriate amplification. Similarly, when received, signal 102 at frequency $f_1$ is cleaned of spurious emissions by the receiving module 116 and passed as signal 214 to the physical layer input 109 of ZIF circuit 108. Accordingly, for the exemplary embodiment illustrated in FIG. 4, the exemplary MIMO system is a 3×3 system wherein the matrix of channel 104 is identical to Equations 2 and 3. To prevent an unintended signal delay between chain 110d and chains 110b and 110c. i.e., the filtered chains, ZIF circuit 108 preferably outputs signal 200 to chain 100d by an appropriate amount so that signal 102 is commonly timed.

In accordance with one embodiment of the present invention, system 100c may be configured so that one of the local oscillator circuits 152 is a master oscillator circuit that permits both chains 110b and 110c to output the same frequency when a suitable switch 149 places the master oscillator in operative control of the other chain's filtering module. In accordance with one embodiment of the present invention, chain 110*d* may be eliminated and ZIF circuit 108 is in direct communication with switch 140.

Figure 5:
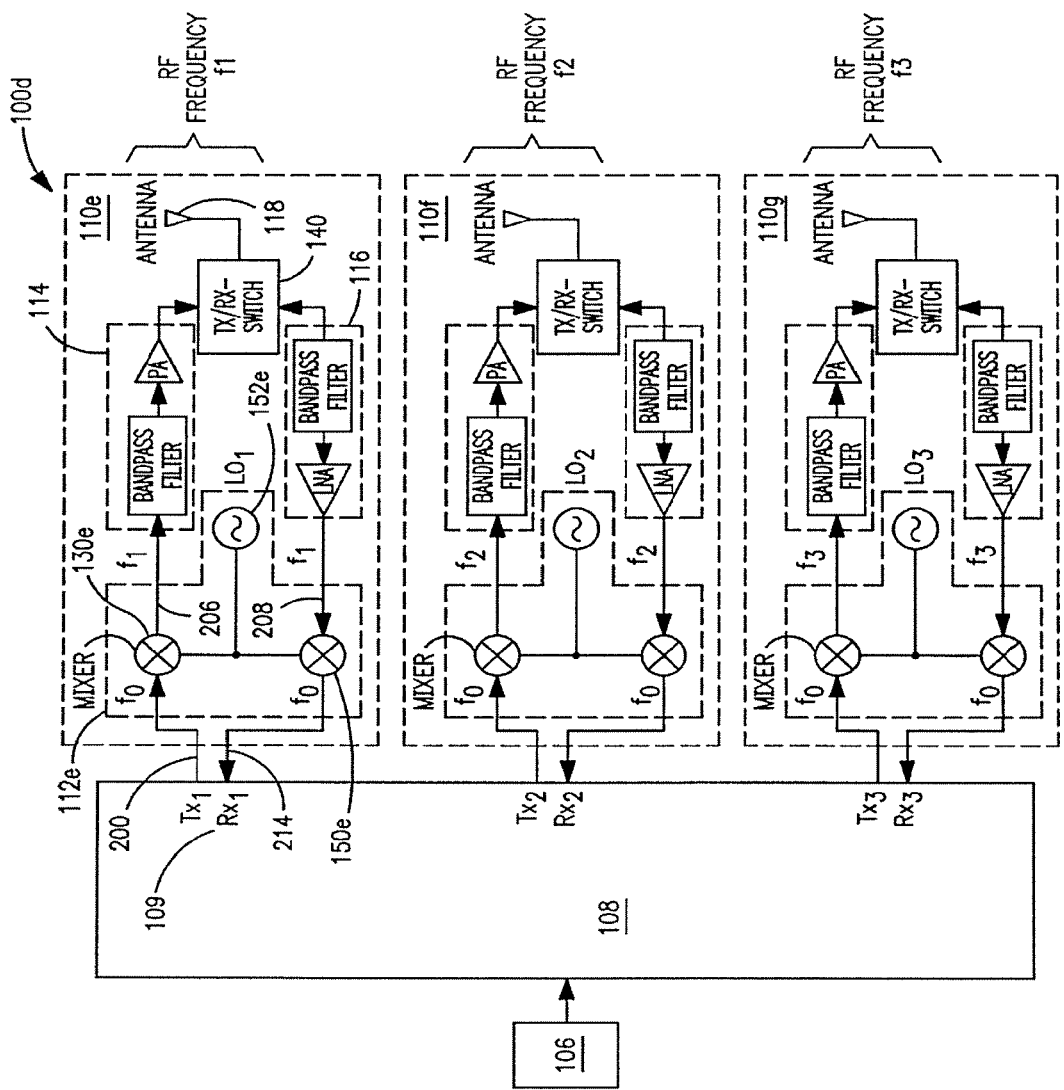
FIG. 5 is a schematic view of a communication system in accordance with one or more further embodiments of the present invention wherein the communications system comprises a plurality of single down-conversion or up-conversion radio frequency chains that on a transmission side apply an independent frequency offset to a base frequency.

FIG. 5 is a schematic view of a communication system in accordance with one or more further embodiments of the present invention, wherein the communications system comprises a plurality of single down-conversion or up-conversion radio frequency chains that, on a transmission side, apply an independent frequency offset to a base frequency. System 100*d* is preferably configured to be operative using MIMO architecture to efficiently transmit data between another system 100*d* and/or other compatible and/or suitably configured system. Thus, system 100*d* may be operative with other systems 100, such as systems 100*a* and/or 100*b*, and comprises essentially like architecture. Thus, the teachings of system 100, i.e., 100*a* and/or 100*b*, are repeated here. However, system 100*d* varies in certain aspects.

Advantageously, system 100*d* provides a cost-effective solution of a simplified architecture that reduces the number of components. System 100*d* permits the independent adjustment of the transmitting frequency of one or more RF chains 110 with a single down-conversion or up-conversion. In a network operating an 802.11 protocol, wherein three chains are used, each chain may be independently adjustable to obtain a desired channel matrix.

System 100*d* comprises a plurality of chains 110. Illustrated in FIG. 5 are three chains 110*e*, 110*f*, and 110*g* used in a network 20 operative with an 802.11 protocol. However, any suitable number of chains may be used. Each of chains 110*e*-110*g* is configured substantially similar to chains 110*a*-110*c*. However, rather than comprising a respective filtering module 112 comprising a double conversion, i.e., filtering module 112*a*, one or more chains 110*e*-110*f* comprise a respective filtering module 112, i.e., filtering module 112*e*. By way of example, filtering module 112*e* comprises a transmission-side mixer circuit 130, i.e., mixer circuit 130*e* that down-converts an output signal 200 from ZIF circuit 108.

As taught herein, output signal 200 is preferably provided at a common frequency, i.e., first frequency $f_0$. Mixer circuit 130*e* down-converts first frequency $f_0$ to a suitable transmission frequency $f_1$ and passes the signal 206 to a suitable transmitter circuit 114 for transmitting signals 102 at a frequency $f_1$ via antenna 118 to an operatively compatible system 100 for receiving.

Respective filtering module 112*e* further comprises a receiver-side mixer circuit 150, i.e., mixer circuit 150*e* that up-converts a signal 208. As discussed herein, signal 102 at a frequency $f_1$ is received via antenna 118 from an operatively compatible system 100 and passed to receiver circuit 116. Receiver circuit 116 cleans signal 102 and passes a cleaned signal 208 to mixer circuit 150*e* for up-conversion to first frequency $f_0$. In turn, the mixer circuit passes signal 214 to ZIF circuit 108. The filtering module further comprises a local oscillator circuit 152*e* provides a suitable frequency control signal to local mixer circuits 130*e* and 150*e*. Filtering modules 110*f* and 110*g* are preferably similarly configured to output a signal 102 at respective frequencies $f_2$ and $f_3$ and to receive the same frequencies. Accordingly, channel 104 is identical to Equations 2 and 3 for the exemplary embodiment illustrated in FIG. 5. Accordingly, for the exemplary embodiment illustrated in FIG. 5, the exemplary MIMO system is a 3×3 system wherein the matrix of channel 104 is identical to Equations 2 and 3.

In accordance with one embodiment of the present invention, system 100*d* may be configured so that one of the local oscillator circuits 152*e* is a master oscillator circuit that permits one or more chains 110*f* and 110*g* to output the same frequency when a suitable switch, such as a switch 149, places the master oscillator in operative control of the other chain's filtering module. One skilled in the art will recognize that other means for frequency offsetting and or frequency offsetting circuits may also be employed and such are contemplated in the scope of the present invention.

Figure 6:
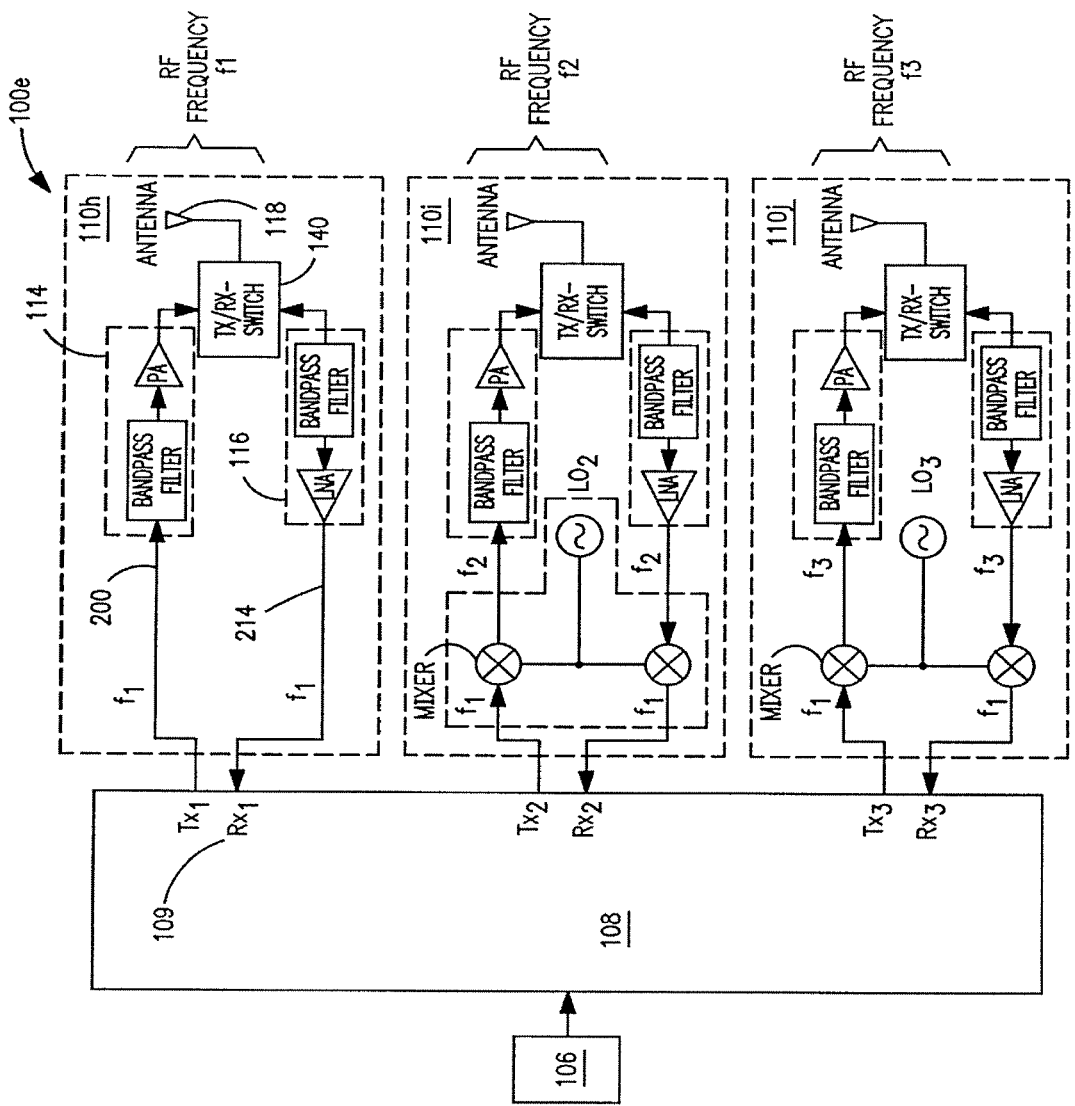
FIG. 6 is a schematic view of a communication system in accordance with one or more further embodiments of the present invention wherein the communications system comprises a radio frequency chain that on a transmission side utilizes a base frequency and one or more single down-conversion or up-conversion radio frequency chains that on a transmission side apply an independent frequency offset to a base frequency.

FIG. 6 is a schematic view of a communication system in accordance with one or more further embodiments of the present invention, wherein the communications system comprises a radio frequency chain that, on a transmission side utilizes a base frequency, and one or more single down-conversion or up-conversion radio frequency chains that, on a transmission side, apply an independent frequency offset to a base frequency. System 100*e* is preferably configured to be operative using MIMO architecture to efficiently transmit data between another system 100*e* and/or other compatible and/or suitably configured system. Thus, system 100*e* may be operative with other systems 100, such as systems 100*a*, 100*b*, 100*c*, and/or 100*d*, and comprises essentially like architecture. Thus, the teachings of system 100, i.e., 100*a*, 100*b*, 100*c*, and/or 100*d*, are repeated here. However, system 100*e* varies in certain aspects.

Advantageously, system 100*e* provides a cost-effective solution of a simplified architecture that reduces the number of components. System 100*d* permits the independent adjustments of the frequency of one or more RF chains 110 with a single down-conversion or up-conversion. In a network operating an 802.11 protocol, wherein three chains are used, at least two chains are independently adjustable to obtain a desired offset frequency while one chain's frequency is substantially identical to the frequency of an output signal of ZIF circuit 108.

System 100*e* comprises a plurality of chains 110. Illustrated in FIG. 6 are three chains 110*h*, 110*i*, and 110*j* that are used in a network 20 operative with an 802.11 protocol. However, any suitable number of chains may be used. System 100*e* includes a chain 110*h* that is configured substantially identical to chain 110*d*, wherein the chain comprises transmitting module 114 and a receiving module 116 that in direct communication with ZIF circuit 108, and a switch 140 as taught herein.

As disclosed, ZIF circuit 108 produces common output signal 200 at a frequency sufficient for transmission. Thus, first frequency $f_0$ is equal to third frequency $f_1$ and may be transmitted as signal 102 after appropriate amplification. Similarly, when received, signal 102 at frequency $f_1$ may be passed directly via receiving module 116 to ZIF circuit 108. Chain 110*i* and 110*j* may be configured substantially similarly as one or more chains 110*e*-110*g*. However, the output signal from ZIF circuit 108 to be down-converted is at a frequency $f_1$, i.e., the transmission frequency of chain 110*h*; and the input signal to ZIF circuit 108 is up-converted to frequency $f_1$. Accordingly, for the exemplary embodiment illustrated in FIG. 6, the exemplary MIMO system is a 3×3 system wherein the matrix of channel 104 is identical to Equations 2 and 3. To prevent an unintended signal delay between chain 110*h* and chains 110*i* and 110*j*, ZIF circuit 108 preferably output signal 200 to chain 100*d* by an appropriate amount so that signal 102 is commonly timed.

In accordance with one embodiment of the present invention, system 100*d* may be configured so that one of the local oscillator circuits is a master oscillator circuit that permits all chains to output the same frequency when a suitable switch places the master oscillator in operative control of the other chain's filtering module. In accordance with one embodiment of the present invention, chain 100*h* may be eliminated and ZIF circuit 108 is in direct communication with a switch 140.

Figure 7:
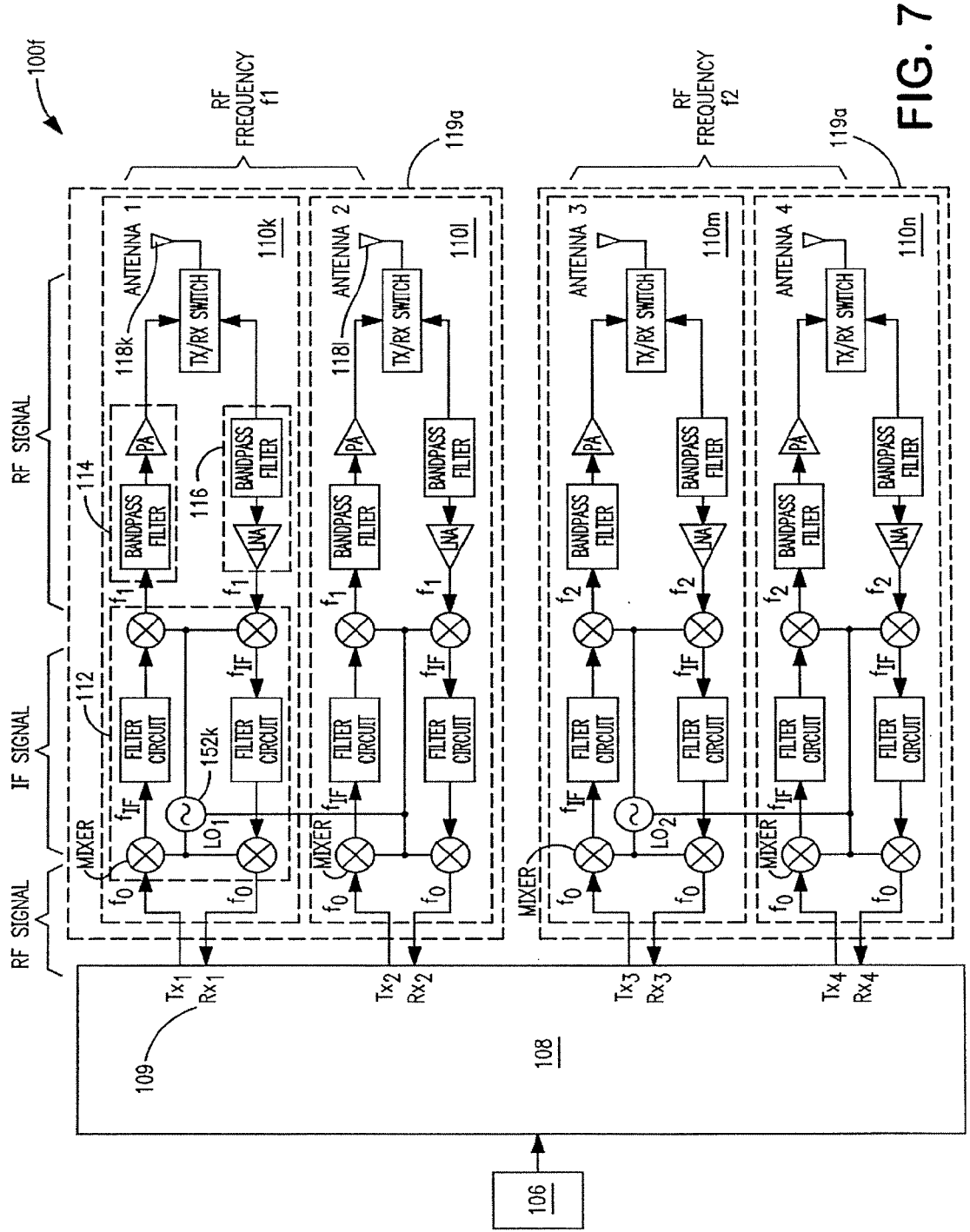
FIG. 7 is a schematic view of a communication system in accordance with one or more further embodiments of the present invention wherein the communications system comprises a plurality of linked radio frequency chains that on a transmission side apply the same frequency offset to a base frequency.

FIG. 7 is a schematic view of a communication system in accordance with one or more further embodiments of the present invention, wherein the communications system comprises a plurality of linked radio frequency chains that, on a transmission side, apply the same frequency offset to a base frequency. System 100*f* is preferably configured to be operative using MIMO architecture to efficiently transmit data between another system 100*f* and/or other compatible and/or suitably configured system. Thus, system 100*f* may be operative with other systems 100 and comprises essentially like architecture. Thus, the teachings of system 100, i.e., 100*a*, 100*b*, 100*c*, 100*d* and/or 100*e*, are repeated here. However, system 100*f* varies in certain aspects.

Advantageously, system 100*f* provides a rugged architecture. System 100*f* permits the independent adjustments of the frequency of linked RF chains 110 with a linked multiple down-conversion or up-conversion. System 100*e* comprises a plurality of chains 110. Illustrated in FIG. 7 are four chains 110*k*, 110*l*, 110*m*, and 110*n* that are operative in a network 20 and configure a 2×2 MIMO system. However, any suitable number of chains may be used. Each of the chains in system 100*e* may be configured substantially similarly as chains 110*a-c*. However, unlike those chains, two or more chains in system 100*e* are linked together into a group 119 by utilizing a common oscillator circuit in the linked chains. For example, the local oscillator circuit of chain 110*l* may be made inoperative or omitted and a local oscillator circuit 152*k* of chain 110*k* may be made operative with chain 110*l* to work in a linked group 119*a*. Similarly, chains 110*m* and 110*n* may be linked in a linked group 119*b*.

Thus, each group of linked chains generates a common transmitting frequency. In the exemplary embodiment of FIG. 7, chains 110*k* and 110*l* generate a frequency $f_1$ and chains 110*m* and 110*n* generate a frequency $f_2$. Thus, for the exemplary embodiment of FIG. 7, the matrix for channel 104 is shown in Equation 4 or more explicitly in Equation 5, wherein a superscript showing the transmitting frequency is indicated.

$$H = \begin{bmatrix} h_{11} & h_{12} & 0 & 0 \\ h_{21} & h_{22} & 0 & 0 \\ 0 & 0 & h_{33} & h_{34} \\ 0 & 0 & h_{43} & h_{44} \end{bmatrix} \quad \text{(Equation 4)}$$

$$H = \begin{bmatrix} h_{11}^{f_1} & h_{12}^{f_1} & 0 & 0 \\ h_{21}^{f_1} & h_{22}^{f_1} & 0 & 0 \\ 0 & 0 & h_{33}^{f_2} & h_{34}^{f_2} \\ 0 & 0 & h_{43}^{f_2} & h_{44}^{f_2} \end{bmatrix} \quad \text{(Equation 5)}$$

Therein, the matrix coefficients are expressed as $h_{TR}$, where T is the transmitting module on a respective chain and R is the receiving module on a respective chain, namely "1" for chain 110*k*, "2" for chain 110*l* "3" for chain 110*m*, and "4" for chain 110*n*. It should be appreciated that if the number of chains that are present=n, the matrix may be suitably adjusted.

In accordance with one or more embodiments of the present invention, in each linked group, the antenna associated with a chain that is a member of the linked group may be advantageously adjusted for polarity. In the exemplary embodiment of FIG. 7, antenna 118*k* and 118*l* are associated with linked chains 110*k* and 110*l*, respectively. Therein, antenna 118*k* and 118*l* comprise a polarization that is orthogonal to the other polarization to advantageously improve signal propagation.

Antenna 118, e.g., antenna 118*k* and/or 118*l*, may comprise single antenna with separate inputs for vertical and horizontal polarization, single antenna with separate inputs for dual slant diversity, single antenna with separate inputs for circular polarization, and/or single antenna with separate inputs for common polarization. Preferably, for each linked chain, each transmitter side of the chain is operably connected to a dual input, polarization diversity antenna such that one chain corresponds to one polarization and a second chain corresponds to a second polarization.

At the receiver side, a similar antenna arrangement is made. Therein, for each linked chain, each receiver side of the chain is operably connected to a dual input, polarization diversity antenna such that one chain corresponds to one polarization and a second chain corresponds to a second polarization. Advantageously, the channel bandwidth is expanded by a factor of two, while reapplying known antenna polarization techniques to achieve an assured bandwidth typically double that of a 2×2 MIMO system.

In accordance with one or more embodiments of the present invention, antennas 118 may be configured to be two separate antennas wherein each comprises inputs for vertical and horizontal polarization, dual slant diversity, circular polarization and/or for a common polarization to allow beam steering of one frequency, e.g., frequency $f_1$, on the first antenna and beam steering of another frequency, e.g., frequency $f_2$ on the second antenna.

In accordance with one embodiment of the present invention, antenna 118 may also be one common antenna comprising four inputs and a common polarization to allow beam steering of one frequency, e.g., frequency $f_1$, on the first antenna and beam steering of another frequency, e.g., frequency $f_2$ on the second antenna.

Figure 8:
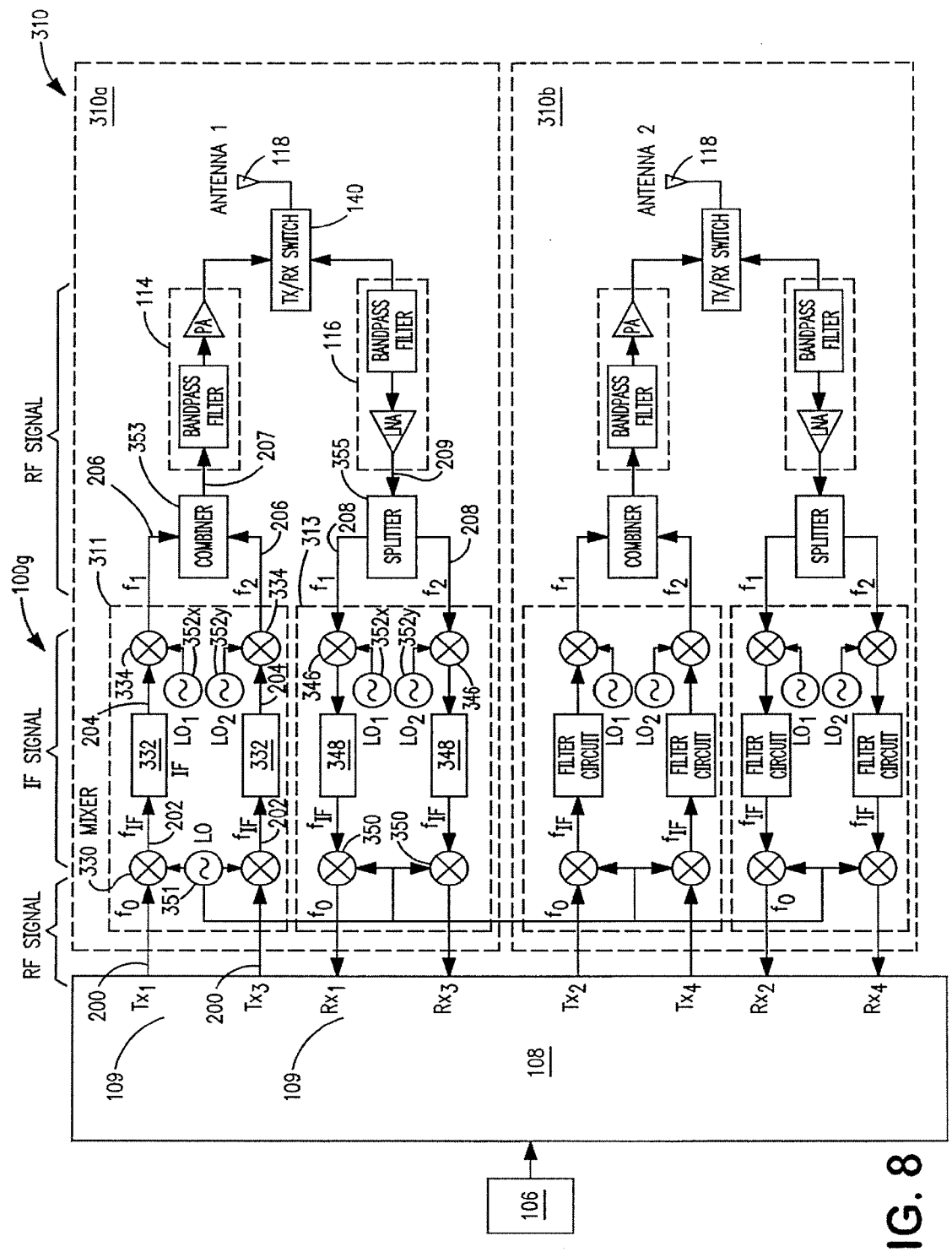
FIG. 8 is a schematic view of a communication system in accordance with one or more further embodiments of the present invention wherein the communications system comprises a plurality of radio frequency chains that on a transmission side apply an independent frequency offset to a base frequency and utilize a combiner to combine a transmitting signal.

FIG. 8 is a schematic view of a communication system in accordance with one or more further embodiments of the present invention, wherein the communications system comprises a plurality of radio frequency chains that, on a transmission side, apply an independent frequency offset to a base frequency and utilize a combiner to combine a transmitting signal. System 100*g* is preferably configured to be operative using MIMO architecture to efficiently transmit data between another system 100*g* and/or other compatible and/or suitably configured system. Thus, system 100*g* may be operative with other systems 100 and comprises essentially like architecture. Thus, the teachings of system 100, i.e., 100*a*, 100*b*, 100*c*, 100*d* and/or 100*e*, are repeated here. Thus, system 100 may be operative with other systems 100, such as systems 100*a*-100*f*. However, system 100*g* varies in certain aspects.

Advantageously, system 100*g* provides an architecture that limits the number physical antennas. System 100*g* operatively permits the independent adjustments of the frequency of RF chains 310 having multiple outputs and inputs. System 100*g* comprises baseband media access controller 106, ZIF circuit 108, and a plurality of receiving and/or transmitting chains 310 operable with one or more receiving and/or transmitting antennas 118. Illustrated in FIG. 8 are two chains. However, any suitable number of chains may be used.

Each chain 310, i.e., chains 310*a* and 310*b*, preferably comprises filtering module 312 that includes a transmitter-side filtering submodule 311 and a receiver-side filtering submodule 313; a transmitter circuit 114 for transmitting signals 102 over channel 104 and/or receiver circuit 116 for receiving signals 102 over a channel 104, depending on whether system 100g is configured to respectively transmit only, receive only, or both, and a switch 140 for switching between transmitting and receiving mode.

As taught herein, on a transmission side, at least one chain 310 is configured to down-convert a common output signal to a frequency that is different than at least one other frequency in transmitting signals 102, e.g., apply a frequency offset to one transmission data stream. On a receiver side, the respective at least one chain 310 is configured to up-convert a frequency offset signal to a common frequency. Thereby, the bandwidth is effectively expanded and greater data delivery is assured.

Each transmitter-side filtering submodule 311 preferably comprises a plurality of initial mixer circuits 330, a plurality of filter circuits 332, secondary mixer circuits 334 in communication with a respective local oscillator circuit 352$x$ or 352$y$, and a combiner 353. Each of the mixer circuits 330 may be substantially identical to mixer circuit 130 taught herein; filter circuits 332 may be substantially identical to filter circuit 132, and oscillator circuit 352 may be substantially identical to oscillator circuit 152; or each may be configured as any suitable component of the type known in the art.

Each mixer circuit 330 is in communication with an output signal 200, as taught herein, of ZIF circuit 108 via physical layer 109. The output signal comprises a common first frequency $f_0$, wherein respective receivers and transmitter of system 100 are operable. Each mixer circuit 330 of each chain preferably down-converts signal 200 at first frequency $f_0$ received from the ZIF circuit 108 to an intermediate frequency $f_{IF}$, i.e., a second frequency $f_{IF}$ to generate a second signal 202. Intermediate frequency $f_{IF}$ may be different than any other intermediate frequency in the same chain, submodule, and/or system. Each initial mixer circuit 330 is preferably in communication with a respective filter circuit 332, which may be substantially identical to filter circuit 132, via an output. Filter circuits 332 filter the down-converted signal 202 to a filtered down-converted signal 204 that is received by a secondary mixer circuit 334.

System 100g preferably includes one common oscillator circuit 351 that is in operative communication with the plurality of initial mixer circuits 330 and a first and second local oscillator 352$x$ and 352$y$ that are in communication with secondary mixer circuits 334. Each oscillator may be configured as any other known oscillator, and, as one skilled in the art will recognize by a plurality of oscillator linked to a common frequency source, i.e., clock. Each secondary mixer circuit 334 is operatively connected to a different local oscillator circuit 352$x$ or 352$y$ and preferably is configured to up-convert the filtered down-converted transmission signal 204 to a respective third frequency, i.e., transmission frequency, to generate a filtered transmission signal 206. Filtered transmission signal 206 comprises transmission signal 200 with the noise, distortion and other spurious signals removed or substantially reduced. Therein, preferably each transmission signal comprises transmission frequency which differs from one or more transmission frequencies in the same submodule in the exemplary embodiment of FIG. 8, each chain includes frequencies $f_1$ and $f_2$.

Respective initial and secondary mixer circuits 330 and 334 provide a double-conversion by translating the transmission signal 200 at first frequency $f_0$ to the lower, third frequency $f_1$ or $f_2$ for filtering, and then translating the resulting filtered signal at intermediate frequencies $f_{IF}$ to higher, third frequencies for transmission. Respective transmission signals 206 are then combined in combiner 353 into a filtered combined transmission signal 207. The combiner is in communication with transmitter circuit 114, which is configured to transmit via a transmitter/receiver diversity switch 140 the filtered transmission signal 207 to another system 100 in network 20 via antenna 118. Combiner 353 may instead be provided after a bandpass filter has filtered transmission signal 206.

System 100g may be configured to receive wireless signals via a receiving antenna, which can be the same or different antenna than antenna 118. The signals received via the receiving antenna are passed via the transmitter/receiver diversity switch 140 to a receiver circuit 116. Receiver circuit 116 is configured to receive signals for the system 100 and may comprise a suitable bandpass filter 144, which receives and appropriately filters the received signals. The resulting bandpass-filtered signal is appropriately amplified by a suitable low-noise amplifier 144 in communication with bandpass filter 142. Receiver circuit 116 and accompanying receiver components may include additional and/or alternative elements necessary for wireless or wired signal reception, depending on, for example, the type of signals being received, the communication medium and protocol, and other like factors. The output of receiver circuit 116 is a received signal 209 at a transmitted frequency.

Each receiver-side filtering submodule 313 preferably comprises a plurality of initial mixer circuits 346 in communication with a respective local oscillator circuit 352$x$ or 352$y$, a plurality of filter circuits 348, and a secondary mixer circuits 350, and a splitter 355. Each of the mixer circuits 346 may be substantially identical to mixer circuit 146 taught herein; filter circuits 348 may be substantially identical to filter circuit 148, and oscillator circuit 352 may be substantially identical to oscillator circuit 152; or each may be configured as any suitable component of the type known in the art. Submodule 313 includes a splitter 355 that appropriately divides received signal 209 into received signals 208 having a frequency $f_1$ and a frequency $f_2$. Each signal 208 is provided to initial receiver mixer circuit 346 which has an input in communication with an output of the splitter. The splitter may be located any other place that is suitable.

Preferably, mixer circuits 346 are configured to receive received signal 208 at transmitted frequency $f_1$. Third mixer circuit 346 may be configured to down-convert the received signal 208 at transmitted frequency $f_1$ to an intermediate frequency $f_{IF}$ to generate a down-converted received signal 210. Submodule 313 preferably includes second filter circuits 348 in communication with an output of mixer circuits 346. Each second filter circuit 348 is configured to filter the down-converted received signal 210 to generate a filtered down-converted received signal 212 at the intermediate frequency $f_{IF}$. Second filter circuit 348 can comprise any suitable type of filter circuit or device that is capable of filtering noise, distortion and other spurious signals from the down-converted received signal 210 at the intermediate frequency $f_{IF}$. Second filter circuit 348 may be configured substantially similar to first filter circuit.

Submodule 313 preferably includes a mixer circuit 150 in communication with an output of the second filter circuit 148. Fourth mixer circuit 350 is preferably configured to up-convert the filtered down-converted received signal 212 to a base frequency $f_0$ to generate a filtered received signal 214. ZIF circuit 108 or other like transmitter, receiver, transceiver or communication circuit/device is in communication with an output of the fourth mixer circuit 350 via physical layer input 109.

Filtered received signal 214 comprises received signal 208 with the noise, distortion and other spurious signals removed or substantially reduced. The third and fourth mixer circuits 346 and 350 provides double-conversion of the received signal 208 at the transmitted frequency $f_1$ to a lower intermediate frequency $f_{IF}$ for filtering, and then translating the resulting filtered signal to a higher, base frequency $f_0$ for reception by the ZIF circuit 108 via physical layer input. In this manner, the frequency offset is reversed to generate a signal for use by a controller that comprises the base frequency of the common output signal.

The exemplary embodiment of FIG. 8 comprises a 4×4 MIMO architecture wherein a frequency offset is created by using two local oscillators. In effect, system 100g provides two 2×2 MIMO system, each connected to its own antenna, wherein each system operates on two different frequencies and have maximal ratio combining ("MRC") gains. Advantageously, only two physical antennas 118 are used. Thus, installation of a system 100g may be possible in locations having limited physical space, such a vehicle having limited roof space.

In accordance with one embodiment of the present invention, system 100g comprises a polarization diversity antenna such that one linked chain corresponds to one polarization and a second linked chain corresponds to a second polarization. Therein, minimum cross polarization coupling XPD between the two RF channels minimizing adjacent channel emissions from frequency $f_0$ into frequency $f_1$ and vice versa, thereby allowing the two frequencies $f_0$ and $f_1$ to be positioned closely together. At the receiver, a similar antenna arrangement is made, with the linked chains connected to a polarization diversity antenna. It is required that the polarization of corresponding pairs signals 102 are aligned. Advantageously, a bandwidth expansion by a factor of two is achieved, which is double that of two 1×1 single-input/single-output systems. Accordingly, channel 104 is identical to Equations 2 and 3 for the exemplary embodiment illustrated in FIG. 8.

Figure 9A:
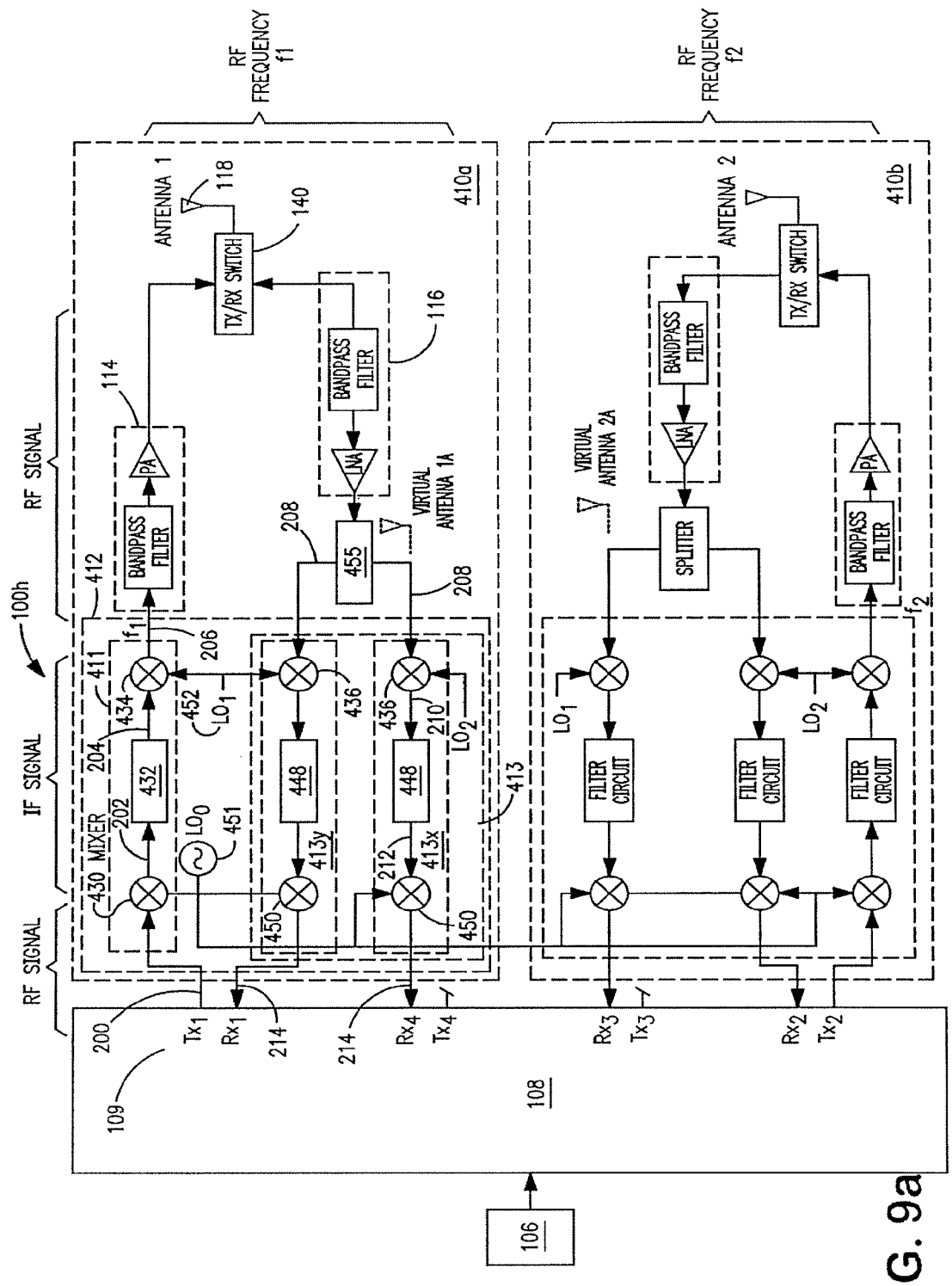
FIG. 9a is a schematic view of a communication system in accordance with one or more further embodiments of the present invention wherein the communications system comprises a plurality of radio frequency chains that are configured to create a virtual antenna on a receiver side.

FIG. 9a is a schematic view of a communication system in accordance with one or more further embodiments of the present invention, wherein the communications system comprises a plurality of radio frequency chains that are configured to create a virtual antenna on a receiver side. System 100h is preferably configured to be operative using MIMO architecture to efficiently transmit data between another system 100h and/or other compatible and/or suitably configured system. Thus, system 100h may be operative with other systems 100 and comprises essentially like architecture. Thus, the teachings of system 100, i.e., 100a-100g, are repeated here. Thus, system 100 may be operative with other systems 100, such as systems 100a-100g. However, system 100h varies in certain aspects.

Advantageously, system 100h is adapted for use with commercially available MIMO systems. Such systems limit the available physical layer transmission outputs from, for example, the ZIF circuit, but have greater number of physical layer receiving inputs. System 100h operatively permits the independent adjustments of the frequency of RF chains 410 having a single physical layer output but multiple inputs. In this manner one receiving channel may be considered to be connected with a virtual antenna.

System 100h comprises baseband media access controller 106, ZIF circuit 108, and a plurality of receiving and/or transmitting chains 410 operable with one or more receiving and/or transmitting antennas 118. Illustrated in FIG. 9a are two chains. However, any suitable number of chains may be used. Each chain 410, i.e., chains 410a and 410b, preferably comprises filtering module 412 comprising a transmitter-side filtering submodule 411 and a plurality of receiver-side filtering submodule 413; a transmitter circuit 114 for transmitting signals 102 over channel 104 and/or receiver circuit 116 for receiving signals 102 over a channel 104 depending on whether system 100h is configured to respectively transmit only, receive only, or both, and a switch 140 for switching between transmitting and receiving mode.

As taught herein, on a transmission side, at least one chain 410 comprises a transmission-side filtering submodule 411. Submodule 411 is configured to receive a common output signal from a physical layer output, down-convert the common output signal, filter and amplify the signal, and transmit it via a physical antenna. Furthermore, at least a second chain 410 is configured to receive a common output signal from a physical layer output, down-convert the common output signal to a frequency that is different than the frequency in another chain, i.e. apply a frequency offset, filter and amplify the signal, and transmit the signal via a physical antenna.

On a receiver side, the respective at least one chain 410 comprises a receiver-side filtering submodule 413. Submodule 413 is configured to receive a transmission signal from a physical antenna, filter and amplify it, split the filtered signal, and pass the signal to two or more branches of the submodule. Each branch of submodule up-converts the signal to a common frequency before passing the up-converted signals to respective physical layer inputs of the ZIF circuit. In this manner, two or more up-converted signals may be obtained from a single physical antenna of the MIMO system, e.g., the MIMO system comprises a physical antenna and one or more virtual antennas.

Transmitter-side filtering submodule 411 preferably comprises a first mixer circuit 430 in communication with a common oscillator circuit 451, a filter circuit 432, second mixer circuits 434 in communication with a local oscillator circuit 452. First mixer circuit 430 may be substantially identical to mixer circuit 130 taught herein; filter circuit 432 may be substantially identical to filter circuit 132, and common oscillator 451 and local oscillator circuit 452 may be substantially identical to local oscillator circuit 152; or each may be configured as any suitable component of the type known in the art. First mixer circuit 430 is in communication with an output signal 200 from a physical layer output 409, as taught herein, of ZIF circuit 108 comprising a common first frequency $f_0$, as taught herein, wherein respective receivers and transmitters of system 100 are operable.

First mixer circuit 430 is in operative communication with common oscillator circuit and preferably down-converts signal 200 at a common first frequency $f_0$ from the ZIF circuit 108 to an intermediate frequency $f_{IF}$, i.e., a second frequency $f_{IF}$ to generate a second signal 202. An output of first mixer circuit 430 is preferably in communication with filter circuit 432 to pass the down-converted signal 202. Filter circuit 432 filters signal 202 to filtered down-converted signal 204 that is received by second mixer circuit 434. Second mixer circuit 434 is operatively connected to local oscillator circuit and preferably up-converts the filtered down-converted transmission signal 204 to a respective third frequency, i.e., transmission frequency, to generate a filtered transmission signal 206.

Filtered transmission signal 206 comprises the transmission signal 200 with the noise, distortion and other spurious signals removed or substantially reduced. Therein, preferably transmission signal 204 comprises transmission frequency which differs from one or more transmission frequencies of the other chains. In the exemplary embodiment of FIG. 9a, a first chain 410a comprises a transmission frequency $f_1$ and while a second chain 410b comprises a transmission frequency $f_2$.

Respective first and second mixer circuits 430 and 434 provide a double-conversion by translating the transmission signal 200 at first frequency $f_0$ to respective intermediate frequencies $f_{IF}$ to a respective third frequency $f_1$ or $f_2$ for filtering, and then translating the resulting filtered signal for transmission. Intermediate frequency $f_{IF}$ may vary between chains and submodules. In this manner, an adjustment, which is independent from adjustments by another chain, is made to the base frequency, i.e., a frequency offset is applied, to generate a signal for transmitting. The transmitted signal comprises a frequency that includes an offset from the frequency of the common output signal wherein the difference in frequency between frequency $f_0$ and frequency $f_1$ comprises the frequency offset.

Second mixer circuit 434 is in communication with transmitter circuit 114, which is configured to transmit via a transmitter/receiver diversity switch 140 the filtered transmission signal 206 to another system 100 in network 20 via physical antenna 118. In the exemplary embodiment of FIG. 9a, ZIF circuit 108 comprises physical layer outputs 409a and 409b, but other physical layer outputs are not.

System 100h may be configured to receive wireless signals 102 via a receiving antenna, which can be the same or different antenna than physical antenna 118. The signals received via the receiving antenna are passed via the transmitter/receiver diversity switch 140 to a receiver circuit 116. Receiver circuit 116 is configured to receive signals for the system 100 and may comprise a suitable bandpass filter 144, which receives and appropriately filters the received signals. The resulting bandpass-filtered signal is appropriately amplified by a suitable low-noise amplifier 144 in communication with bandpass filter 142. Receiver circuit 116 and accompanying receiver components may include additional and/or alternative elements necessary for wireless or wired signal reception, depending on, for example, the type of signals being received, the communication medium and protocol, and other like factors. The output of receiver circuit 116 is a received signal 209.

Each receiver-side filtering submodule 413 preferably comprises a plurality of initial mixer circuits 446, a plurality of filter circuits 448, and secondary mixer circuits 450 in communication with common oscillator circuit 451 or any other suitable oscillator circuit, and a splitter 455. Each of the mixer circuits 446 may be substantially identical to mixer circuit 146 taught herein; filter circuits 448 may be substantially identical to filter circuit 148, or each may be configured as any suitable component of the type known in the art.

Splitter 455, which may be located wherever suitable, preferably divides filtered received signal 209 into two or more received signals 208 having a suitable frequency and is passed to a branch of the submodule based on the orthogonality of the received signal 209. In the exemplary embodiment of FIG. 9a, each chain includes a receiver-side submodule 413, which each has two or more branches, e.g., branches 413x and 413y. Respective signal 208 is provided to two or more branches that comprise initial receiver mixer circuit 446, filter circuit 448 and mixer circuit 450. In each branch, mixer circuit 446 comprises an input in communication with an output of the splitter.

Preferably, each initial mixer circuit 446 is preferably configured to be in communication with a local oscillator circuit. In the exemplary embodiment of FIG. 9a, at least one mixer circuit 446 preferably is in communication with local oscillator 452x, which also in communication with mixer circuit 434, while one or more other mixer circuits are in communication with local oscillator circuit 452. Each mixer circuit 446 is configured to receive signal 208 at frequency $f_1$ and down-convert the received signal 208 from frequency $f_1$ to an intermediate frequency $f_{IF}$ to generate a down-converted received signal 210. Intermediate frequency $f_{IF}$ may vary between branches.

Filter circuit 448 is in communication with an output of mixer circuit 346 and filters the down-converted received signal 210 to generate a filtered down-converted received signal 212 at the intermediate frequency $f_{IF}$. Filter circuit 348 can comprise any suitable type of filter circuit or device that is capable of filtering noise, distortion and other spurious signals from the down-converted received signal 210 at the intermediate frequency $f_{IF}$. Secondary mixer circuit 450 is in communication with an output of filter circuit 448 and up-converts the filtered down-converted received signal 212 to a frequency $f_0$ to generate a filtered received signal 214 that is provided to ZIF circuit 108 via physical layer inputs 109b. Filtered received signal 214 comprises received signal 208 with the noise, distortion and other spurious signals removed or substantially reduced.

In the exemplary embodiment of FIG. 9a, the initial and secondary mixer circuits 446 and 450 provide provides double-conversion of the filtered received signal 209 from a frequency $f_1$ to a frequency $f_0$ for input into ZIF circuit 108 via physical layer inputs 109 by dividing the filtered received signal 209 into one or more signals 208 that are passed to branches of the submodule. In this manner, the frequency offset is reversed to generate a signal for use by a controller that comprises a frequency of the common output signal.

The exemplary embodiment of FIG. 9a comprises a 2×4 MIMO architecture wherein a frequency offset is created by using two local oscillator circuits. In effect, system 100h provides two 2×2 MIMO system, each connected to its own antenna, wherein each system operates on two different frequencies and have maximal ratio combining ("MRC") gains. Advantageously, only two physical antennas are present. By dividing the filtered received signal, one or more branches may be configured to have a virtual antenna 118x. In this manner, fewer physical antennas are need permitting installation in applications having limited physical space. Also advantageously, even though a limited number of transmitters are used, a greater number of receivers are used.

Thus, for the exemplary embodiment of FIG. 9a, the matrix for channel 104 is shown in Equation 6 or more explicitly in Equation 7, wherein a superscript showing the transmitting frequency is indicated.

$$H = \begin{bmatrix} h_{11} & 0 \\ 0 & h_{22} \\ h_{31} & 0 \\ 0 & h_{42} \end{bmatrix} \quad \text{(Equation 6)}$$

$$H = \begin{bmatrix} h_{11}^{f_1} & 0 \\ 0 & h_{22}^{f_2} \\ h_{31}^{f_1} & 0 \\ 0 & h_{42}^{f_2} \end{bmatrix} \quad \text{(Equation 7)}$$

Figure 9B:
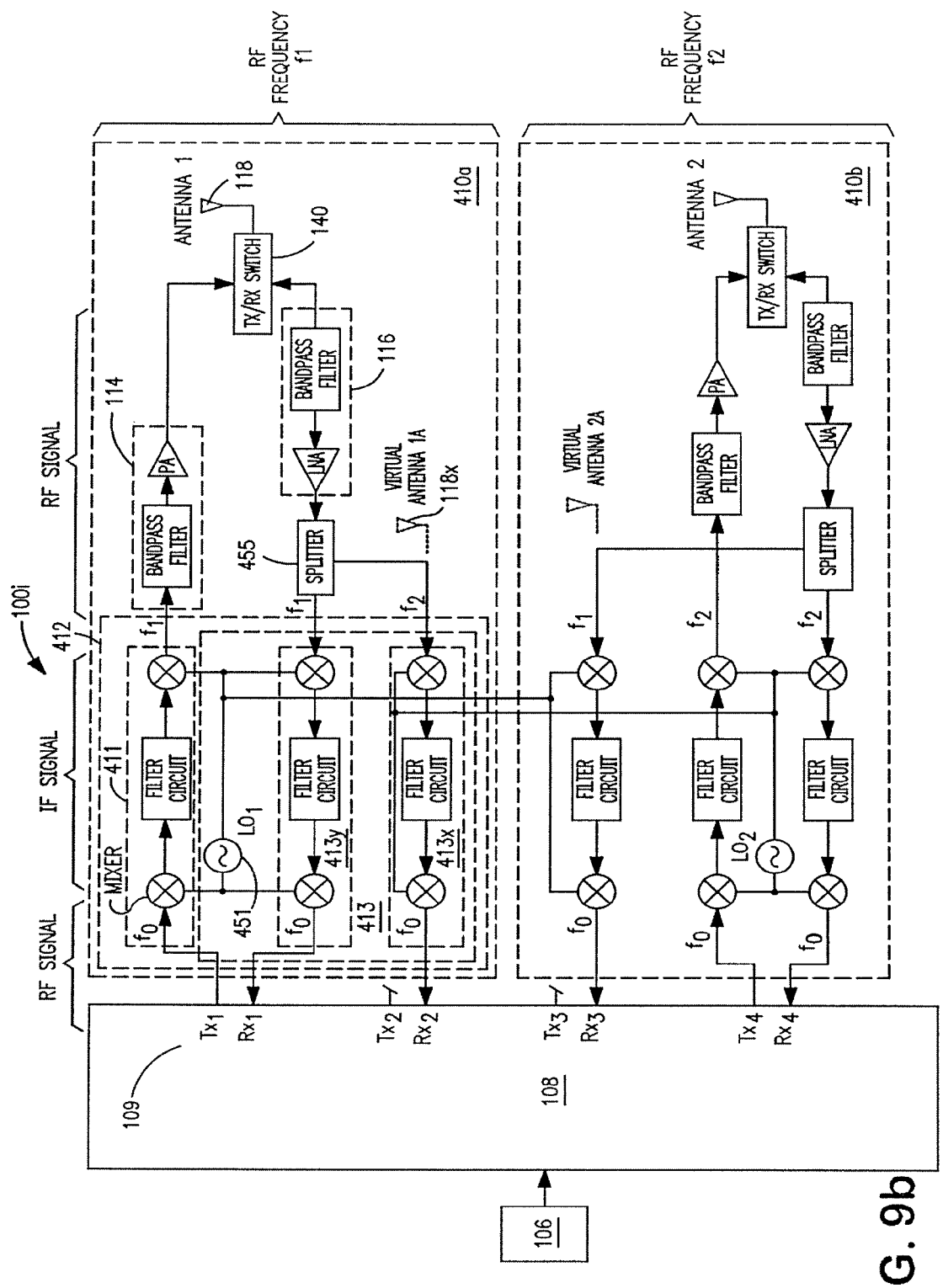

FIG. 9b is a schematic view of an embodiment of a communications system of FIG. 9a. Therein, a plurality of common oscillator circuits are provided and operatively connected. Thus, a system 100i rather than comprising local oscillator circuits as in system 100h, common oscillator circuit 451 is operative with all mixer circuits of the transmission-side filtration submodule and one branch of the receiver-side filtration submodule. Common oscillator circuit 451 is in further communication with one or more branches of a receiving side submodule of other chains 410. Similarly, one or more other common oscillator circuits 451 of another chain is in communication with a respective branch of the receiver-side filtration submodule such that each branch of the receiver-side filtration submodule is in communication with a different common oscillator circuit. Thus, for the exemplary embodiment of FIG. 9b, the matrix for channel 104 is shown in Equation 6 or more explicitly in Equation 7, wherein a superscript showing the transmitting frequency is indicated.

Figure 9C:
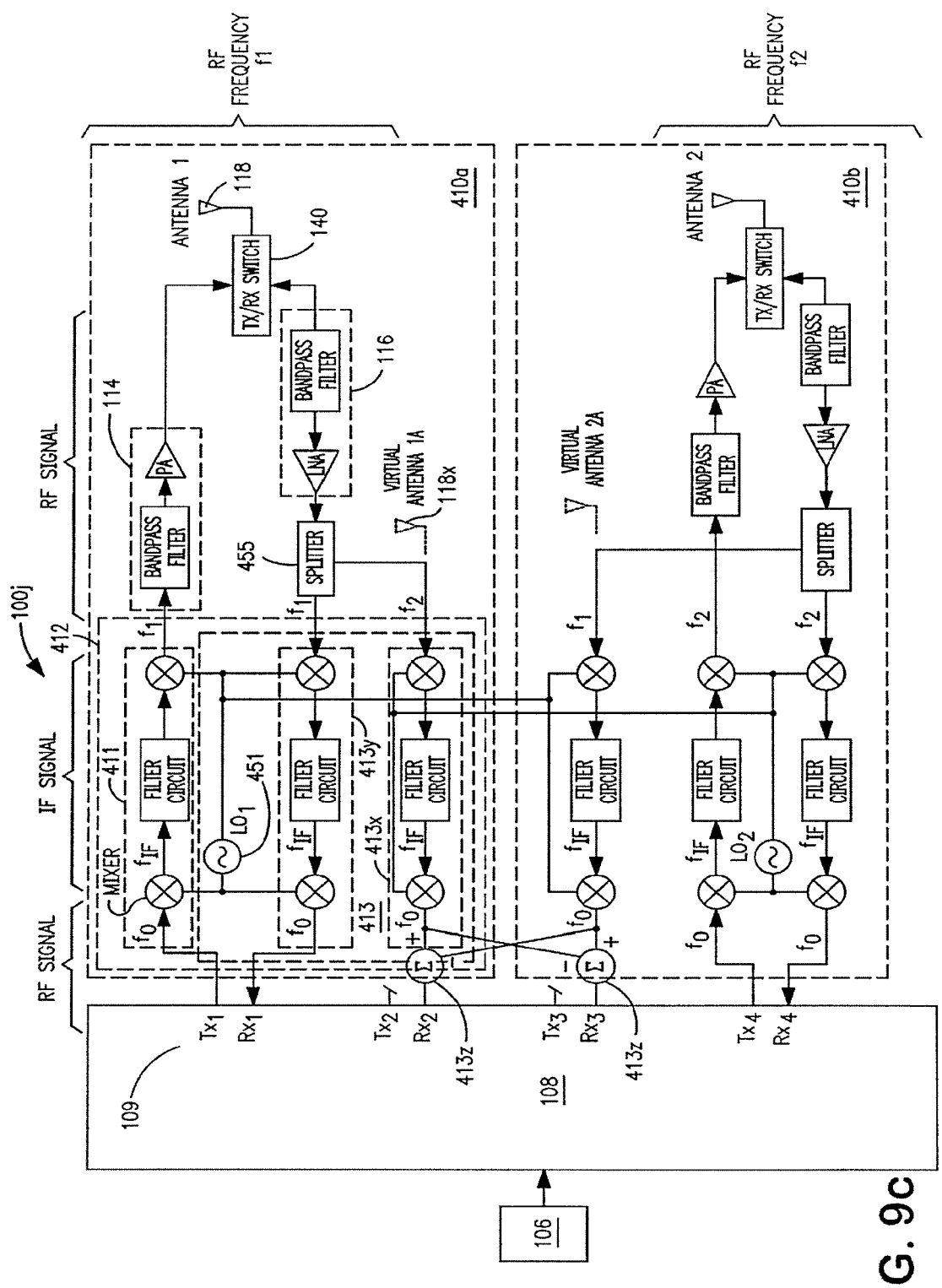

FIG. 9c is a schematic view of an embodiment of a communications system of FIG. 9a. Therein, system 100j comprises a receiver-side submodule 413 using one or more selectable frequency gain circuit 413z for enabling MRC gains. The circuit is in communication with a physical layer input 109 to transmit the resulting signal for advantageously being used with FM radio reception and detection. If the gain circuits are not selected, additional MRC gains will not be realized. Thus, for the exemplary embodiment of FIG. 9c, the matrix for channel 104 is shown in Equation 8 or more explicitly in Equation 9, wherein a superscript showing the transmitting frequency is indicated.

$$H = \begin{bmatrix} h_{11} & 0 \\ 0 & h_{22} \\ h_{31} & h_{32} \\ h_{31} & -h_{32} \end{bmatrix}$$ (Equation 8)

$$H = \begin{bmatrix} h_{11}^{f_1} & 0 \\ 0 & h_{22}^{f_2} \\ h_{31}^{f_1} & h_{32}^{f_2} \\ h_{31}^{f_1} & -h_{32}^{f_2} \end{bmatrix}$$ (Equation 9)

Figure 9D:
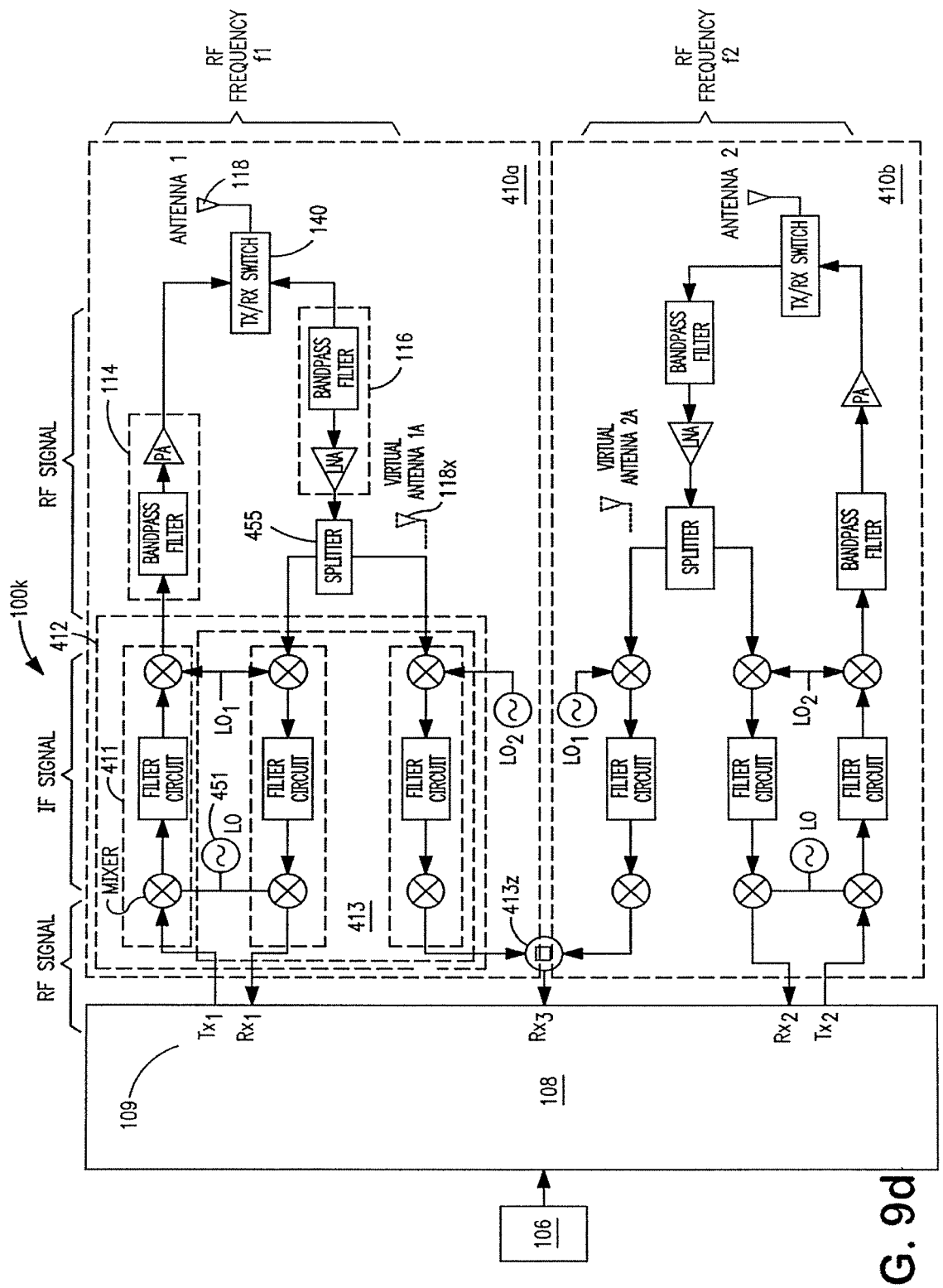
FIG. 9d is a schematic view of a communication system in accordance with one or more further embodiments of the present invention.

FIG. 9d is a schematic view of a communication system in accordance with one or more further embodiments of the present invention wherein the communications system comprises a plurality of radio frequency chains that are configured to create a virtual antenna on a receiver side. System 100k is preferably configured to be operative using MIMO architecture to efficiently transmit data between another system 100k and/or other compatible and/or suitably configured system. Thus, system 100i may be operative with other systems 100 and comprises essentially like architecture. Thus, the teachings of system 100, i.e., 100a-100h, are repeated here. Thus, system 100 may be operative with other systems 100, such as systems 100a-100h.

System 100i is substantially similar to system 100h. However, system 100i provides for additional combining of the filtered received signal 214 by combining a signal of one branch 413x of one receiver-side submodule 413 with another branch 413x of one receiver-side submodule 413 using one or more selectable frequency gain circuit 413z for enabling MRC gains. The circuit is in communication with a physical layer input 109 to transmit the resulting signal. If the gain circuit is not selected, additional MRC gains will not be realized.

The exemplary embodiment of FIG. 9d comprises a 2×3 MIMO architecture wherein a frequency offset is created by using two local oscillator circuits. In effect, system 100i is connected only two physical antennas, but has a greater number of receiver-side physical inputs than antennas. By dividing the filtered received signal, one or more branches may be configured to have a virtual antenna 118x. In this manner, fewer physical antennas are need permitting installation in applications having limited physical space. Also advantageously, even though a limited number of transmitters are used, a greater number of receivers are used.

In accordance with one or more embodiments of the present invention, system 100 may comprise baseband controller wherein signal outputs 200 comprise different frequencies rather than a common frequency $f_0$.

In accordance with one or more embodiments of the present invention, system 100 comprises RF converter in communication with a baseband controller. The RF converter preferably receives MIMO baseband inputs and then converts them to independently tunable RF outputs.

In accordance with one or more embodiments of the present invention, system 100 is independent of MIMO technology, whether it be 802.11n, 802.16d, 802.16e, or other possible future wireless technologies which employ multiple-input/multiple-output (MIMO) technology for both same frequency transmissions as well as frequency shifting, i.e., frequency offsetting, transmissions.

In accordance with one or more embodiments of the present invention, system 100 may used for multimode or restricted multimode optical fiber systems as a means of improving throughput.

FIG. 10a is a schematic view of a ZIF circuit in accordance with one or more embodiments of the present invention. A ZIF circuit 508, such as ZIF circuit 108, may be configured to produce independently tunable ZIF output frequencies to supply a communications system, such as communications system 100. For clarity, the communications system is referred to as communications system 500 and comprise any suitable communications system, especially any embodiment of communications system 100, e.g., 100a-100h. ZIF circuit 508 may be operative with a baseband media access controller, such as baseband controller 106. ZIF circuit 508 is preferably configured to comprise a plurality of independently tunable RF chains 510 that is operative with an antenna, such as antenna 118, to generate a plurality of signals 102 comprising a plurality of frequencies $f_1, f_2, \ldots f_N$ for transmission and reception of signals comprising matched frequencies $f_1, f_2, \ldots f_N$.

FIG. 10b is a schematic view of the ZIF circuit of FIG. 10a in accordance with one or more embodiments of the present invention. Therein, communications system 500 comprises three RF chains 510 and a frequency synthesizer 501 that are integrated in ZIF circuit 508 to produce a plurality of frequencies. Preferably, frequency synthesizer 501 is a common synthesizer used in all RF chains 510a of ZIF circuit 508.

Figure 10C:
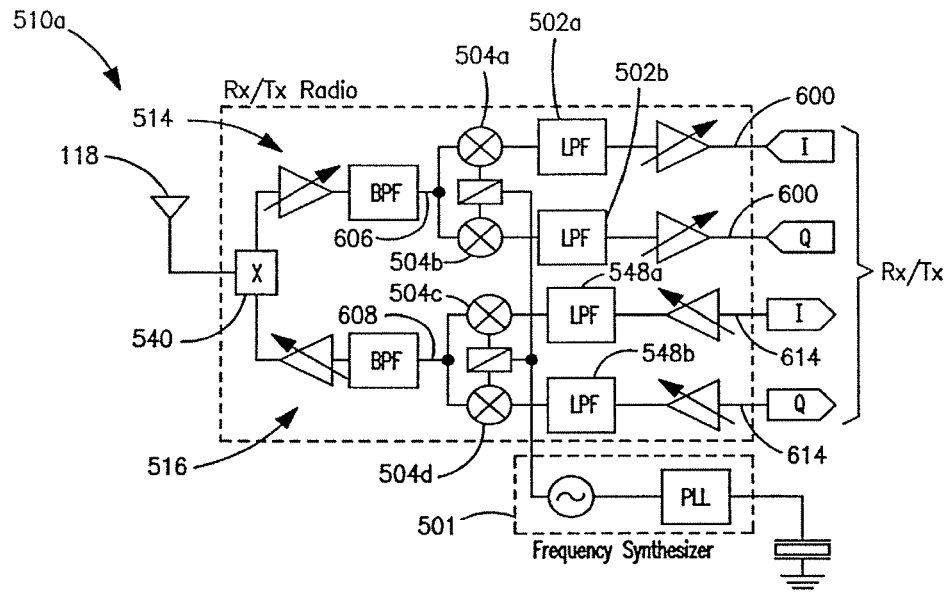
FIG. 10c is a schematic view of a detail of an RF chain of FIG. 10b in accordance with one or more further embodiments of the present invention.

FIG. 10c is a schematic view of a detail of an RF chain of FIG. 10b in accordance with one or more embodiments of the present invention. RF chain 510 is configured as RF chain 510a comprising substantially RF chain 110i integrated on the ZIF circuit for, for example, a 3×3 MIMO system. RF chain 510a comprises in-phase and quadrature-phase (IQ) input signals 600 and a frequency synthesizer 501, which may be any suitable synthesizer, to apply a single frequency offset in order to mix I/Q signals 600 to an RF output signal 606 at a predetermined frequency, such frequency $f_2, \ldots f_N$. The frequency synthesizer is connected to a crystal 625 that provides a frequency reference.

Signal 600 at a baseband frequency, such as frequency $f_0$, of the I branch is passed to a low pass filter circuit 502a in communication with a mixing circuit 504a, while signal 600 of the Q branch is similarly passed to a low pass filter circuit 502b in communication with a mixing circuit 504b. Each of the mixer circuits is in communication with the synthesizer 501, which preferably comprises RF oscillator circuit or the like including a suitable Phase Locked Loop ("PLL") oscillator circuit or the like. The mixer circuits apply a frequency offset to signal 600 to achieve a signal 606 at a predetermined frequency, such frequency $f_1, f_2, \ldots f_N$, wherein each chain of ZIF circuit 508 comprises a different one of these frequencies.

Respective RF output signal 606 of the I and Q branches is joined and then passed to a transmitter circuit 514 comprising a bandpass filter and an amplifier. In turn, the transmitter circuit passes signal 606 to a switch 540 that is operative with an antenna 118. A signal 102 received from antenna 118 is passed via switch 540 to a receiving circuit 516 comprising a bandpass filter and an amplifier. Mixer circuits 504c and 504d are operative with the amplifier to received signal 608 from the amplifier. Signal 608 comprises one of the predetermined frequency, such frequency $f_1, f_2, \ldots f_N$. Mixer circuits 504c and 504d are operative with synthesizer 501 to up-convert signal 608 to a signal 614 comprising the baseband frequency, such as frequency $f_0$ for the I and Q branches. A pair of low pass filter 548a, 548b are operatively connected to amplifiers and pass signal 614 to each of the I and Q branches.

Advantageously, RF chain 510a comprises a "true" ZIF, since there is no intermediate frequency produced. Herein, chain 510a utilizes a single frequency synthesizer frequency offset to mix I/Q signals up to RF outputs. Preferably, the synthesizer is configured to the desired RF output frequency, for example 5.4 GHz. Also, preferably, synthesizer 501 comprises a common synthesizer used in each of the RF chains 510a of ZIF circuit 508.

Figure 10D:
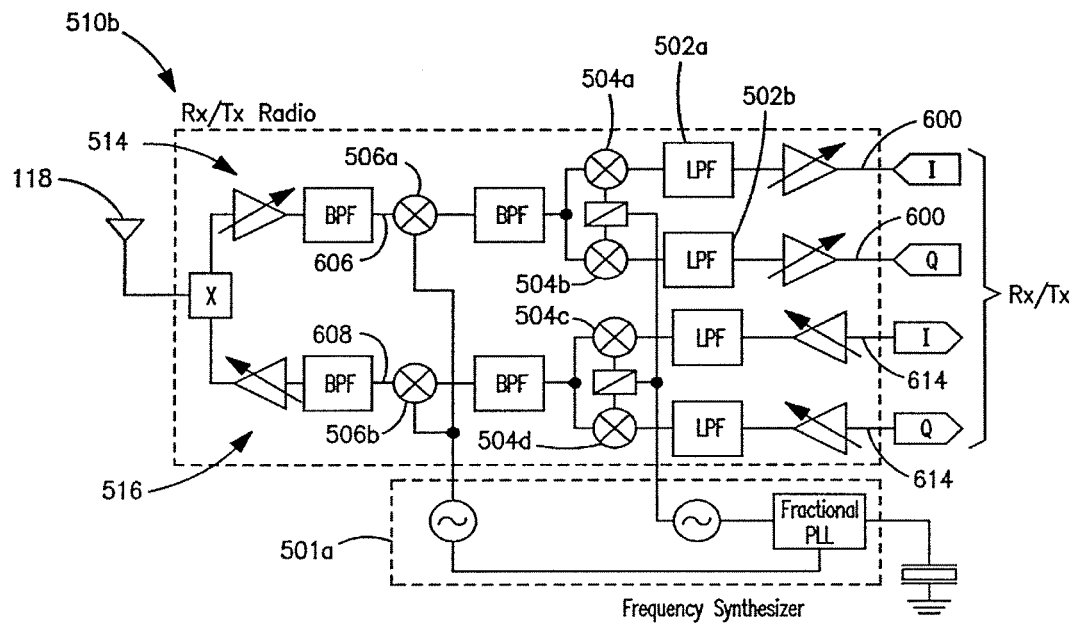
FIG. 10d is a schematic view of a detail of an RF chain of FIG. 10b in accordance with one or more further embodiments of the present invention.

FIG. 10d is a schematic view of a detail of an RF chain of FIG. 10b in accordance with one or more further embodiments of the present invention. RF chain 510 is configured as RF chain 510b comprising substantially multiple integrated on the ZIF circuit for, for example, a 3×3 MIMO system. On the transmission side, RF chain 510b is configured substantially similarly as RF chain 510a. However, chain 510b differs in some aspects. RF chain 510b comprises a first mixer 504a, 504b and a second mixer 506a to internally generate an intermediate frequency, and then up convert that frequency to an RF output signal 606. On the receiving side, RF chain 510b is configured substantially similarly as RF chain 510a. However, chain 510b differs in some aspects. RF chain 510b comprises a second mixer 506b to internally generate an intermediate frequency from received signal 608 and a first mixer 504c, 504d that up convert that frequency to baseband input signal 614. Herein, synthesizer 501 is configured as a fractional synthesizer 501a, which may be a ⅓-⅔ synthesizer (as shown), where the synthesizer is operating at 3.6 GHz, and provides both 1.8 GHz and 3.6 GHz outputs to mix the RF signal from IQ baseband up to 3.6 GHz (i.e., the IF frequency) and then up to 5.4 GHz.

FIG. 10e is a schematic view of the ZIF circuit of FIG. 10a in accordance with one or more embodiments of the present invention. Therein, communications system 500 comprises three RF chains 510 each comprising an independent frequency synthesizer 501b, wherein each chain is integrated in ZIF circuit 508 to produce a plurality of frequencies. Preferably, frequency synthesizer 501 is a common synthesizer used in all RF chains 510a of ZIF circuit 508. Despite the fact that RF chain generates an intermediate frequency, the intermediate frequency is not detected and rather the outputs appears to be a ZIF output, since the internal IF is not seen externally to the ZIF circuit.

Figure 10H:
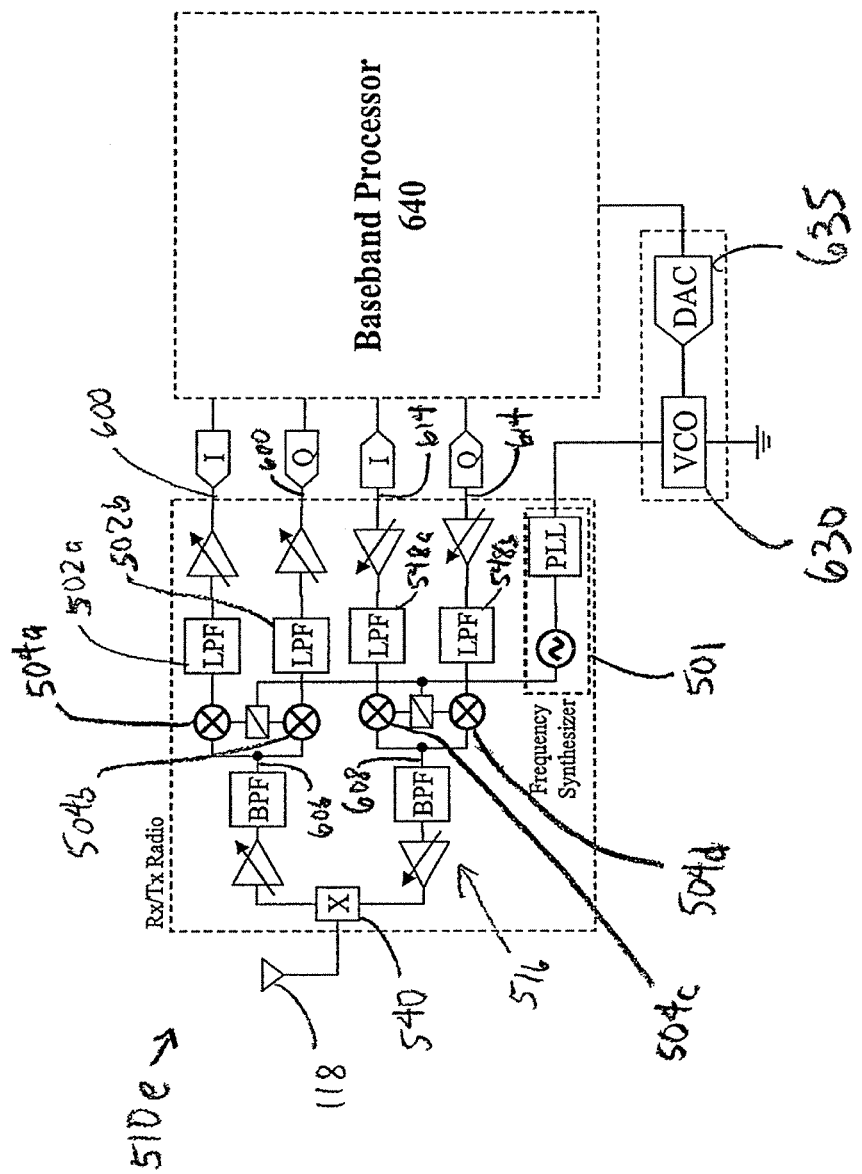
FIG. 10h is a schematic view of a detail of an RF chain of FIG. 10e in accordance with one or more further embodiments of the present invention.
Figure 10F:
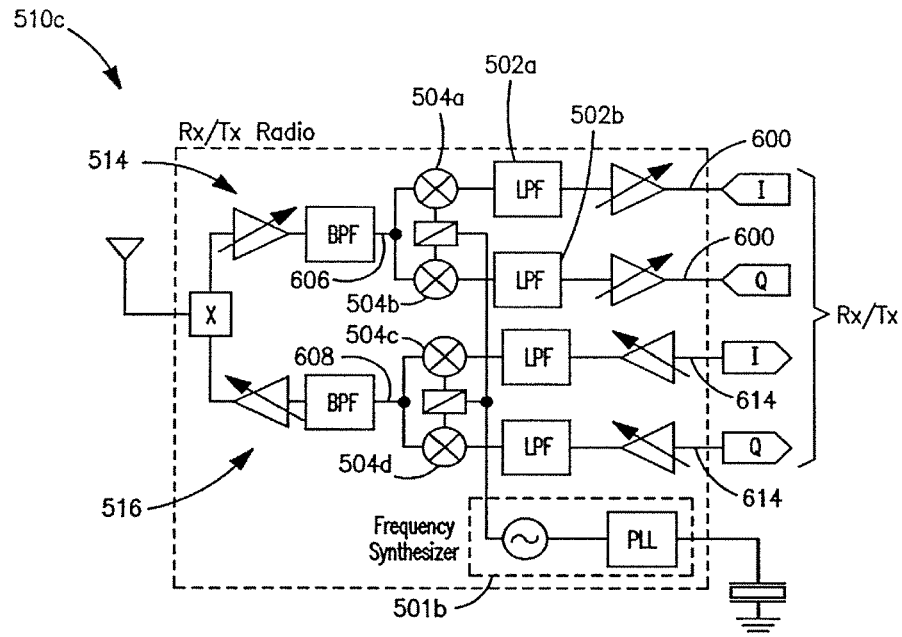
FIG. 10f is a schematic view of a detail of an RF chain of FIG. 10e in accordance with one or more further embodiments of the present invention.

FIG. 10f is a schematic view of a detail of an RF chain of FIG. 10e in accordance with one or more embodiments of the present invention. RF chain 510 is configured as RF chain 510c comprising substantially multiple integrated on the ZIF circuit for, for example, a 3×3 MIMO system. RF chain 510c is configured substantially similarly as RF chain 510a. However, chain 510c differs in some aspects. RF chain 510c includes a single mixer circuit for each of the I and Q branches. However, each chain 510c comprises a independent synthesizer 501 configured as an independent frequency synthesizer 501b to apply a frequency offset to the I/Q signals 600 to achieve a signal 606 at a predetermined frequency, such frequency $f_1, f_2, \ldots f_N$, wherein each chain of ZIF circuit 508 comprises a different one of these frequencies.

Figure 10G:
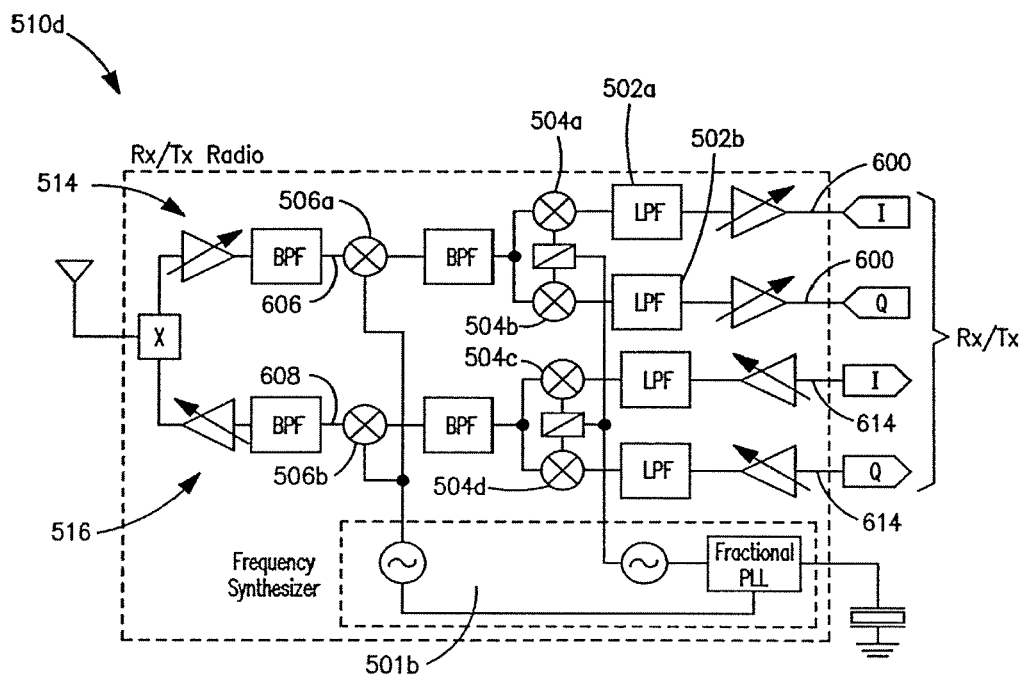
FIG. 10g is a schematic view of a detail of an RF chain of FIG. 10e in accordance with one or more further embodiments of the present invention.

FIG. 10g is a schematic view of a detail of an RF chain of FIG. 10e in accordance with one or more further embodiments of the present invention. RF chain 510 is configured as RF chain 510d comprising substantially multiple integrated on the ZIF circuit for, for example, a 3×3 MIMO system. RF chain 510d is configured substantially similarly as RF chain 510b. However, chain 510d differs in some aspects. RF chain 510d comprises a first mixer 504 and a second mixer 506 to internally generate an intermediate frequency, and then up convert that frequency to an RF output signal 606. However, each chain 510d comprises an independent frequency synthesizer 501a to apply a frequency offset to the I/Q signals 600 to achieve a signal 606 at a predetermined frequency, such frequency $f_1, f_2, \ldots f_N$, wherein each chain of ZIF circuit 508 comprises a different one of these frequencies. Therein, RF chains 510c and 510d utilize preferably different synthesizers 501a for all radio Tx/Rx chains in the same ZIF circuit 508 to apply a frequency offset to the IQ signals to generate signals at an IF frequency, and then to different RF frequencies.

FIG. 10h is a schematic view of a detail of an RF chain of FIG. 10e in accordance with one or more further embodiments of the present invention. RF chain 510 is configured as RF chain 510e comprising substantially multiple integrated on the ZIF circuit for, for example, a 3×3 MIMO system. RF chain 510e is configured substantially similarly as RF chain 510c. However, chain 510e differs in some aspects. In lieu of a crystal, RF chain 510e includes a voltage-controlled oscillator (VCO) 630 and a digital-to-analog converter (DAC) 635 for providing a frequency reference to the frequency synthesizer 501b. It is noted that the VCO 630 and the DAC 635 may be integrated into a single component. Additionally, RF chain 510e includes a baseband processor 640, which accepts all of the I and Q branches as inputs. The baseband processor 640 extracts a carrier frequency offset (CFO) from the I and Q inputs, and then uses an algorithm according to an embodiment of the present invention to control the DAC 635 and the VCO 630.

In accordance with one or more embodiments of the present invention, switch elements may be provided between each synthesizer 501b to permit one or more synthesizers to control two or more chains 510 for operating independent chains 510 to operate in standard MIMO mode on the same frequencies. It should be appreciated that the ZIF circuit 508 may be configured in many different ways by, for example, utilizing different synthesizer designs, different filtering, the use of differential signals and summing at RF rather than IF, and these are contemplated in the present invention.

Figure 11:
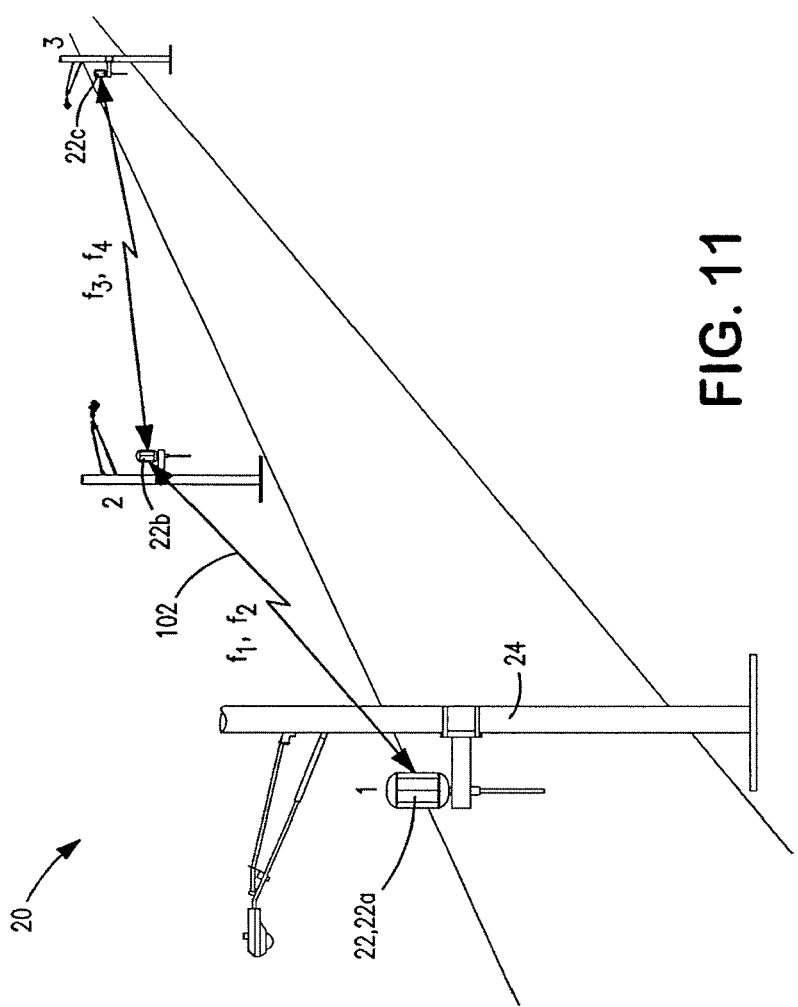
FIG. 11 is a perspective view of a portion of a communications network in accordance with one or more embodiments of the present invention.

FIG. 11 is a perspective view of a portion of a communications network in accordance with one or more embodiments of the present invention. A portion of network 20 comprises physical points of presence network element 22 disposed operably on a physical structure 24, such as a light pole. Each point of presence network element comprises any suitable communications system 100 taught herein and is preferably provided in a suitable weather-tight operative physical embodiment as is known in the art.

Each communication system is preferably in operative communication with another communications system 100 using MIMO technology with a plurality of frequencies, wherein at least one frequency comprises an offset frequency, to be functional as a network backhaul. For example, one communications system at a first network element 22*a* may use signals 102 comprising a first and second frequency $f_1$ and $f_2$ to communicate with another communications system at a second network element 22*b*. As taught herein, at least one of the frequencies $f_1$ or $f_2$ comprises a frequency offset to permit efficient communications using MIMO technology. Second network element 22*b* is communication not only with the communications system of the first network element, but also a communications system 100 of a third network element 22*c* using signals 102 comprising different frequencies $f_3$ and $f_4$, wherein one or more frequencies comprises a frequency offset to permit efficient communications using MIMO technology. Thus, by passing signals 102 from one network element to a subsequent network element, signals 102 may reach a junction with a landline or backbone.

In accordance with one or more embodiments of the present invention, a cost effective backhaul means may be provided. A network element 22 comprising any system 100 may be in communication by sending different frequencies of the MIMO channel to different points of presence using different physical or virtual antennas. For example, network element 22*a* may be in communication with network element 22*b* via frequency $f_1$ and in communication with network element 22*c* via frequency $f_2$ by suitably orienting the antenna nodes.

The channel matrix for system 100 to network element 22*b* may comprise only a single coefficient $h_{11}$ for frequency $f_1$ and matrix coefficient $h_{22}$ approaches zero while the matrix of channel 104 for system 100 to network element 22*b* may comprise only a single coefficient h11 approaches zero and while matrix coefficient h22 for frequency $f_2$ is non-zero. Therein, system 100 comprises a low cost radio capable supporting frequency specific radio links to different systems using a single-input/single-output system.

Figure 12:
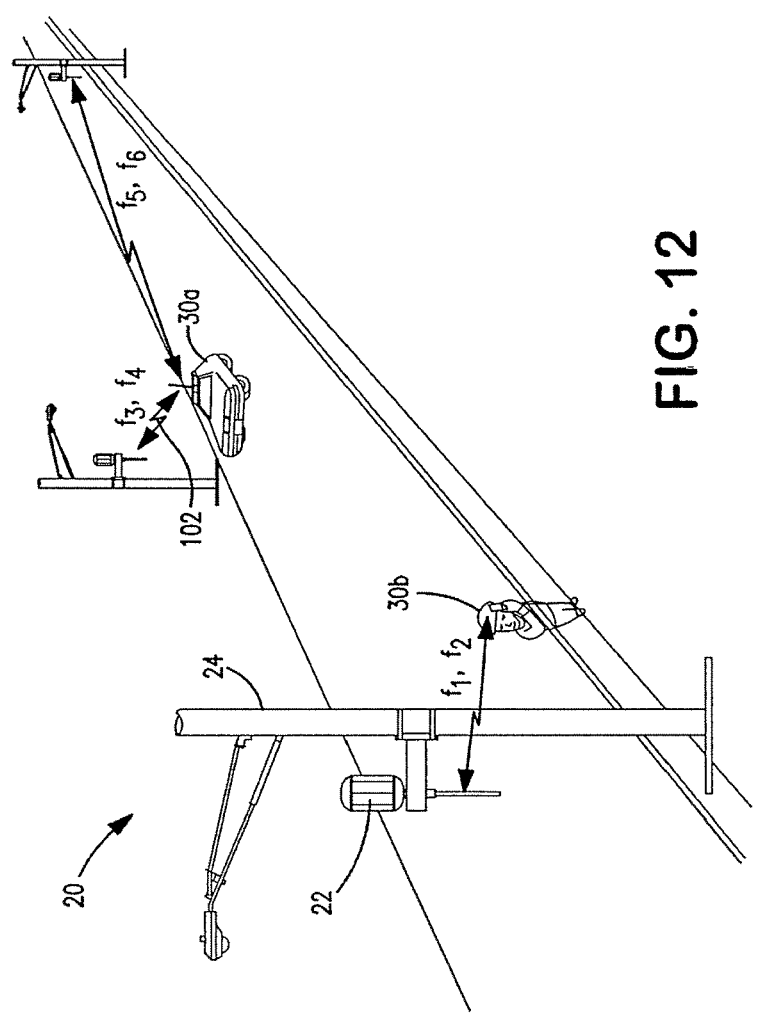
FIG. 12 is a perspective view of the portion of the communications network of FIG. 11 wherein user communication devices are operative with the network.

FIG. 12 is a perspective view of the portion of the communications network of FIG. 11 wherein user communication devices are operative with the network. Advantageously, the MIMO architecture of system 100 incorporating a frequency offset improves the bandwidth is effectively expanded and greater data delivery is assured for mobile or static device users. Therein, user 30*a* in the form of a vehicle utilizing a vehicle-borne system 100 is configured as a mobile device user, while user 30*b* utilizing a cellular telephone based system 100 is configured as a static device user. Certain vehicles, such as police cruisers, lack sufficient space, especially on the roof, for all communication devices. Thus, these users are permitted only a single antenna for data services. Advantageously, by utilizing a system 100, specifically system 100*h* or 100*i*, additional physical antennas are not needed because the system utilizes virtual antennas.

In accordance with one or more embodiments of the present invention, a user interface may be provided to control system 100 via a control system. The interface and/or control system may be configured as a command line interface, a graphical user interface, web-based graphical user interface, or a linked networked management system. The control system sets and monitors the status of the frequencies associated with each channel 104. Therein, the control system is able to select one or more frequencies in one or more systems 100 based on known or detected interference to minimize the interference. For example, the control system may configure operative systems 100 such that a first system 100 is in communication with a second system 100 using a channel in UNII2, while third and fourth systems 100 in possible interfering vicinity are operative in a channel in an ISM band.

Even therein, vastly different ISM bands such as 928 MHz and 5.47 GHz are available to be selected by the control system. For example, one channel may be operative at 928 MHz, which selected for its increased reach and lower attenuation through foliage, or a channel in a licensed band (2.5-2.7 GHz and a second channel in an unlicensed band may be selected to allow for guaranteed services in the licensed band and additional bandwidth in the unlicensed band.

In accordance with one or more embodiments of the present invention, system 100 comprises an antenna diversity switch and/or control system for one or more of the receiver-side transmission chains to select the strongest channel. For example, system 100 may be configured to permit beam steering to one or more antennas 118 whether the chains 100 are linked or not. Thus, antenna 118 or any other suitable antenna may comprise parallel radiating elements to enable beam steering.

The present invention describes a method and an apparatus for synchronizing the receivers to the transmitters, or vice versa, for a MIMO-based frequency shifted system. In a preferred embodiment, the method of the present invention is used in a point-to-point (P2P) or point-to-multipoint (P2MP) backhaul system where a master-slave or similar (e.g., AP-Client or BS-MS) arrangement exists. A control system is run on the slave system. The control system employs the carrier frequency offset of the received packets from the master system (or vice versa, or distributed so that algorithms are run on both master and slave) to adjust and control the clock recovery of the slave system, thereby aligning it to the master system.

Wi-Fi and WiMAX chips use the pilot tones from an incoming packet to estimate the carrier frequency offset (CFO) as it processes the OFDM signals. These chips often estimate the course frequency error during the synchronization symbols, and may employ a Coordinate Rotational Digital Computer (CORDIC) functional element to determine a more accurate CFO that is calculated while a packet is being received. Normally, the CFO is used for debugging purposes, and is present in the low level physical interface.

The CFO represents the difference in the carrier frequency of a transmitted packet with respect to the receiver's clock frequency. For example, if a packet is transmitted by a master system at 6 GHz+10 pp, then the actual transmission frequency will be 6,000,060,000 Hz. If that same packet is received by a Wi-Fi or WiMAX radio with a crystal at −10 ppm (i.e., 5,999,940,000 Hz), then the CFO will be 6,000,060,000 Hz−5,999,940,000 Hz=120,000 Hz=120 kHz.

The present invention uses the CFO to offset the main oscillator on the slave device to align it to the master device. By adjusting the slave crystal to be +10 ppm, the CFO will read a value of 0 Hz, indicating that the two clocks are locked. The reason for locking the two clocks is to enable the MIMO bandwith expansion techniques to be employed without requiring expensive crystals, or GPS, or IEEE 1588-based timing circuits or alternate frequency locking methods to be employed.

In practice, the crystals will not be exactly locked. A small error in clock frequencies will increase the error vector magnitude (EVM) of the demodulated signal. However, the EVM and the magnitude of the clock frequency error must be kept within an acceptable tolerance range. Two main factors determine the level of an acceptable clock recovery. The first is how far apart the MIMO signals are transmitted, and the second is the maximum allowed EVM contribution due to clock error.

Figure 13:
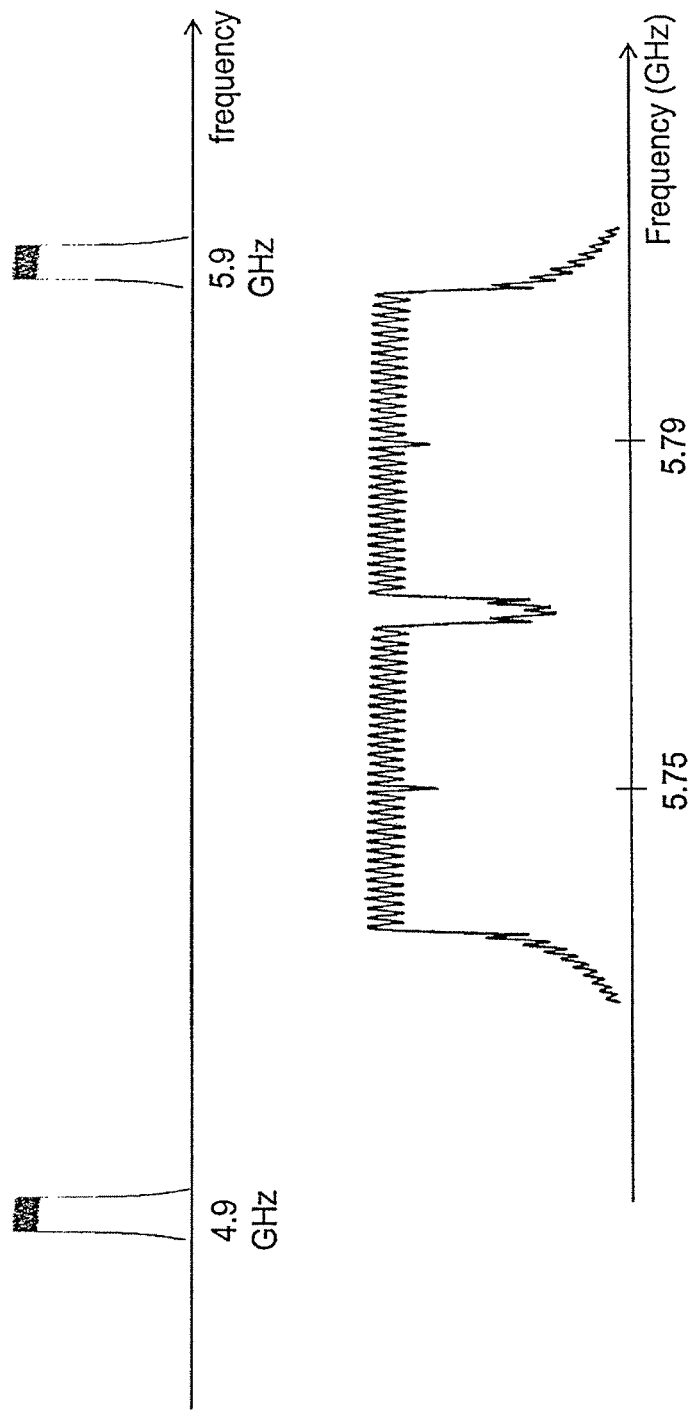
FIG. 13 is a graphical illustration of several signals being communicated by a MIMO system in accordance with one or more further embodiments of the present invention.

Referring to FIG. 13, the present invention enables low cost adjustable oscillators to be used for MIMO frequency expansion techniques. Although it can be used for any carrier frequency into the tens or hundreds of gigahertz, in a preferred embodiment, the carrier frequency is below 6 GHz, as these frequencies are particularly applicable to RF links deployed on light poles, wooden poles, or just above street level. Below 6 GHz, the available bands include 4.94-4.99 GHz; 5.15-5.85 GHz; 5.85-5.925 GHz; and 2.4-2.4825 GHz for Wi-Fi; or 2.3-2.36 GHz, 2.5-2.7 GHz, and 3.5-3.785 GHz for WiMAX-type transmissions. In general, the worst case expected condition exists when the MIMO expansion moves frequencies apart by approximately 1 GHz, such as is the case where one signal is in the 5.8 GHz ISM band and a second signal is in the 4.94 GHz public safety band, or a WiMax signal is transmitted at 2.5 GHz and a second signal is transmitted at 3.5 GHz. Therefore, for these reasons and for simplicity of calculations, it is assumed that a reasonable frequency separation of the MIMO signals is equal to 1 GHz.

For a 64 quadrature amplitude modulation (64 QAM) signal, the EVM must be less than or equal to −24 decibels. In a preferred embodiment of the invention, the error vector magnitude (EVM) is less than or equal to −30 dB, thus providing a 6 dB margin. A 3 dB increase in EVM to −27 dB would be acceptable and not excessively onerous. For an EVM less than or equal to −27 DB, the error introduced by the clock error must be less than or equal to −30 dB. This is an acceptable EVM contribution for Wi-Fi 64 QAM signals. The maximum EVM contribution may need to be lower for 256 QAM or 1024 QAM signals. Accordingly, a goal of the present invention is to allow signals to be separated by up to 1 GHz and to have the carrier frequency offset be small enough to have less than a 3 dB reduction in EVM for a 64 QAM signal.

EVM is a measurement of modulator performance in the presence of impairments. The soft symbol decisions obtained after decimating the recovered waveform at the demodulator output are compared against the ideal symbol locations. The root mean square (rms) EVM and phase error are then used in determining the EVM measurement over a window of N demodulated symbols.

Referring to FIG. 11, the symbol decision output by the demodulator is given by w and the ideal symbol location (using the symbol map) is given by v. The resulting error vector is the difference between the actual measured and ideal symbol vectors: $e=w-v$. The error vector e is graphically represented in FIG. 11: v is the ideal symbol vector; w is the measured symbol vector; w−v is the magnitude error; θ is the phase error; $e=w-v$ is the error vector, and e/v is the EVM.

For a normalized symbol vector Iv) of unity, and given that the error vector e is largely caused by rotation and thus is approximately perpendicular to v, then for small errors, $e/v=\sin(\theta)\approx\theta$. The acceptable EVM is $20*\log(e/v)=-30$ dB. Therefore $e/v\approx\theta=10-30/20$, and v=1, thus θ=0.032 radians=2 degrees. For a 2 degree error during a 250 μs packet, the allowed carrier frequency error is (2/360/0.25 ms)=22 Hz. For a 22 Hz error, under the worst case condition of a 1 GHz frequency offset, the clocks must be locked to 22/1 GHz=22 parts per billion (ppb). Although this may appear to be an aggressively tight specification, because it represents a clock error which is approximately 1000 times better than most off-the-shelf crystals which are specified to ±20 ppm, it is in fact easily achievable with a real-time control algorithm given a real-time stream of ten or more CFO estimates on the order of 2000 Hz or better per second. Using simple techniques, such as least mean squared error or Kalman filter algorithms, noise from CFO measurements derived on a packet-by-packet basis can be extracted and minimized to the point where the clock frequencies are locked to within 66 Hz.

As an example, BelAir Networks has developed similar timing capabilities for circuit emulation services as described in U.S. patent application Ser. No. 11/963,524, entitled "Method for Estimating and Monitoring Timing Errors in Packet Data Networks", the contents of which are incorporated herein by reference in their entirety. Referring to FIG. 12, exemplary data are shown which indicated clock recovery errors on the order of less than 10 ppb. As a result, the required clock accuracy changes from 22 ppb to 550 ppb, which can easily be achieved using low cost off-the-shelf voltage controlled oscillators (VCOs) without temperature compensation. Accordingly, this embodiment relies upon a simple VCO system, with the ability to extract CFO measurements from the received packet data stream.

In another embodiment of the present invention, the system may not require a tolerance of 22 ppb. By comparison with the embodiment described above, the only parameter that is changed is the allowed frequency offset. By placing frequency-shifted channels as contiguous 40 MHz blocks, the frequency tolerance is thereby reduced from 1 GHz to 40 MHz, i.e., a factor of 25.

In another embodiment, alternative means for locking the physical layers may be employed. Two of the most practical such means include global positioning system (GPS) timing sources and IEEE 1588 timing reference sources. GPS clocks are widely used today to lock WiMAX data streams for the purposes of ensuring timing and frequency accuracy; and aligning base transceiver station (BTS) timing sources to allow multi-radio BTS units to align all of their transmitters. Such an alignment ensures that the high power radios are not transmitting while they are receiving, which would otherwise result in significant degradations in receiver sensitivities, because common antennas are used for multiple radios. Although the BTS systems are timed via a GPS source, conventional BTS systems have not been known to employ this timing for the purpose of MIMO frequency shifting prior to the present invention.

The problem with GPS timing is the inability to rely on these solutions in urban canyons, where surrounding tall buildings effectively cut off line-of-sight paths to satellites required for timing generation. This is not an issue for roof-mounted GPS systems, but it is an issue for street-level-mounted GPS timing systems.

The second alternative means is the use of an IEEE 1588 timing source, where all wireless units employ an IEEE 1588 timing receiver block which communicates to one or more timing servers using IP packet data to transfer timing information. These systems are not limited by the same "urban canyon" issues as GPS timing systems; however, IEEE 1588 systems have not been known to be reliably employed to generate GPS stratum level timing.

Finally, other means may be employed, such as oven-controlled, temperature-compensated crystal oscillators (OCTCXOs). Such devices are available with an accuracy of 100 ppb, and it is expected that these sources may improve to achieve 50 ppb with new technologies that monitor and address aging. However, the use of an OCTCXO is relatively expensive by comparison with other means described above.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A method of synchronizing a receiver with a transmitter in a communications system comprising a multiple-input/multiple-output (MIMO) architecture, the architecture comprising a first and a second radio frequency chain, the receiver being connected to a controller, the communications system being configured to transceive at least two signals having a predetermined frequency separation, and the method comprising the step of locking a frequency of the receiver to a frequency of the transmitter by configuring the controller to perform the steps of:
   a) using a packet transmitted by the transmitter and received by the receiver to generate a carrier frequency offset (CFO) estimate;
   b) adjusting the receiver reference frequency based on the CFO estimate; and
   c) repeating steps a) and b) until the generated CFO estimate is substantially equal to zero.

2. The method of claim 1, wherein the controller comprises at least one of an open-loop controller; a closed-loop controller; a proportional controller; an integral controller; a derivative controller; and a Kalman filter.

3. A method of synchronizing a receiver with a transmitter in a communications system comprising a multiple-input/multiple-output (MIMO) architecture, the architecture comprising a first and a second radio frequency chain, the transmitter being connected to a controller, the communications system being configured to transceive at least two signals having a predetermined frequency separation, and the method comprising the step of locking a frequency of the transmitter to a frequency of the receiver by configuring the controller to perform the steps of:
   a) using a packet transmitted by the receiver and received by the transmitter to generate a carrier frequency offset (CFO) estimate;
   b) adjusting the transmitter reference frequency based on the CFO estimate; and
   c) repeating steps a) and b) until the generated CFO estimate is substantially equal to zero.

4. The method of claim 3, wherein the controller comprises at least one of an open-loop controller; a closed-loop controller; a proportional controller; an integral controller; a derivative controller; and a Kalman filter.

* * * * *

UNITED STATES PATENT AND TRADEMARK OFFICE
CERTIFICATE OF CORRECTION

PATENT NO.       : 8,433,254 B2  
APPLICATION NO.  : 13/595153  
DATED            : April 30, 2013  
INVENTOR(S)      : Soul et al.

Page 1 of 1

It is certified that error appears in the above-identified patent and that said Letters Patent is hereby corrected as shown below:

In the Drawings

In Fig. 10a, Sheet 13 of 19, delete "  ".

In the Specification

In Column 33, Line 32, delete "h11" and insert -- $h_{11}$ --, therefor.

In Column 33, Line 33, delete "h22" and insert -- $h_{22}$ --, therefor.

In Column 34, Line 53, delete "bandwith" and insert -- bandwidth --, therefor.

Signed and Sealed this  
Second Day of December, 2014

Michelle K. Lee  
*Deputy Director of the United States Patent and Trademark Office*